United States Patent
Kubo

(10) Patent No.: US 6,774,423 B2
(45) Date of Patent: Aug. 10, 2004

(54) SEMICONDUCTOR DEVICE HAVING A CAPACITOR WITH INCREASED CAPACITANCE

(75) Inventor: Shunji Kubo, Hyogo (JP)

(73) Assignee: Renesas Technology Corp., Tokyo (JP)

(*) Notice: Subject to any disclaimer, the term of this patent is extended or adjusted under 35 U.S.C. 154(b) by 48 days.

(21) Appl. No.: 10/425,929

(22) Filed: Apr. 30, 2003

(65) Prior Publication Data

US 2004/0124457 A1 Jul. 1, 2004

(30) Foreign Application Priority Data

Dec. 25, 2002 (JP) .................................. 2002-373669

(51) Int. Cl.[7] .................. H01L 27/108; H01L 29/76; H01L 29/94; H01L 31/119

(52) U.S. Cl. .................................. 257/303; 257/306

(58) Field of Search .................................. 438/253, 254, 438/255, 396, 397, 398; 257/296, 303, 306–311

(56) References Cited

U.S. PATENT DOCUMENTS 6,583,461 B2 * 6/2003 Yokoyama et al. .......... 438/396

FOREIGN PATENT DOCUMENTS

JP          P2001-196553 A     7/2001

* cited by examiner

Primary Examiner—Long Pham
Assistant Examiner—Hoai Pham
(74) Attorney, Agent, or Firm—McDermott Will & Emery LLP

(57) ABSTRACT

A memory cell part of a semiconductor substrate is formed with a cylindrical capacitor opening extending perpendicularly to the main surface of the semiconductor substrate. The cylindrical capacitor opening passes through a silicon oxide film, a silicon nitride film and another silicon oxide film in this order. A capacitor lower electrode, a dielectric film and a capacitor upper electrode are formed in the cylindrical capacitor opening along the surface of the cylindrical capacitor opening. The bottom surface of the cylindrical capacitor opening is formed below the main surface of silicon nitride film. Thus obtained is a semiconductor device capable of improving refreshability and soft error resistance.

3 Claims, 24 Drawing Sheets

SEMICONDUCTOR DEVICE HAVING A CAPACITOR WITH INCREASED CAPACITANCE

BACKGROUND OF THE INVENTION

1. Field of the Invention

The present invention relates to a semiconductor device comprising a capacitor.

2. Description of the Background Art

In general, a conventional semiconductor device includes a transistor and a capacitor formed on the transistor along a hole extending perpendicularly to the main surface of a semiconductor substrate. In this capacitor, the aforementioned hole is generally provided to pass through a multi-level insulator film stacked on the transistor.

In the structure of such a conventional capacitor, it may be impossible to provided further away the position of an upper portion of the hole in which a capacitor is formed from the main surface of the semiconductor substrate. In this case, the capacitance of the capacitor cannot be increased. Consequently, refreshability and soft error resistance of the semiconductor device cannot be improved.

SUMMARY OF THE INVENTION

An object of the present invention is to provide a semiconductor device capable of improving refreshability and soft error resistance also when the position of an upper portion of a hole in which a capacitor is formed cannot be provided further away from the main surface of a semiconductor substrate.

A semiconductor device comprises a transistor provided on a semiconductor substrate, a first etching stopper film formed to cover the transistor and a first insulator film formed on the first etching stopper film.

The semiconductor device also comprises a second etching stopper film formed on the first insulator film to cover the transistor and a second insulator film formed on the second etching stopper film.

The semiconductor device further comprises a capacitor electrically connected to the transistor above the second insulator film.

A lower electrode, a dielectric film and an upper electrode of the capacitor are sequentially formed in a hole extending perpendicularly to the main surface of the semiconductor substrate along the surface of the hole.

The hole passes through the second insulator film, the second etching stopper film and the first insulator film. The bottom surface of the hole is located below the main surface of the first stopper film.

According to the aforementioned structure, the height of the hole extending perpendicularly to the main surface of the semiconductor substrate between the semiconductor substrate and a wiring part of a memory cell part can be maximized as compared with a hole, formed with the capacitor, located above the main surface of the second etching stopper film.

Consequently, the surface area of the lower electrode of the capacitor formed along the surface of the hole can be maximized also when the upper portion of the hole cannot be provided further away from the semiconductor substrate. According to the aforementioned semiconductor device, therefore, the capacitance of the capacitor can be maximized.

A semiconductor device according to a second aspect of the present invention comprises a semiconductor substrate and a first insulator film formed above the semiconductor substrate to extend substantially in parallel with the main surface of the semiconductor substrate.

The semiconductor device also comprises a first hole passing through the first insulator film perpendicularly to the main surface of the semiconductor substrate and a second insulator film formed on the first insulator film.

The semiconductor device further comprises a second hole located inside the opening of the first hole to pass through the first insulator film perpendicularly to the main surface of the semiconductor substrate.

In the aforementioned structure, a capacitor lower electrode is formed over the entire inner side surface of the first hole along the inner side surface.

According to the aforementioned structure, the surface area of the capacitor lower electrode can be maximized in the first hole without further providing away the upper portion of the first hole from the main surface of the semiconductor substrate. Therefore, the capacitance of a capacitor can be maximized when the upper portion of the hole formed with the capacitor cannot be provided away from the main surface of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
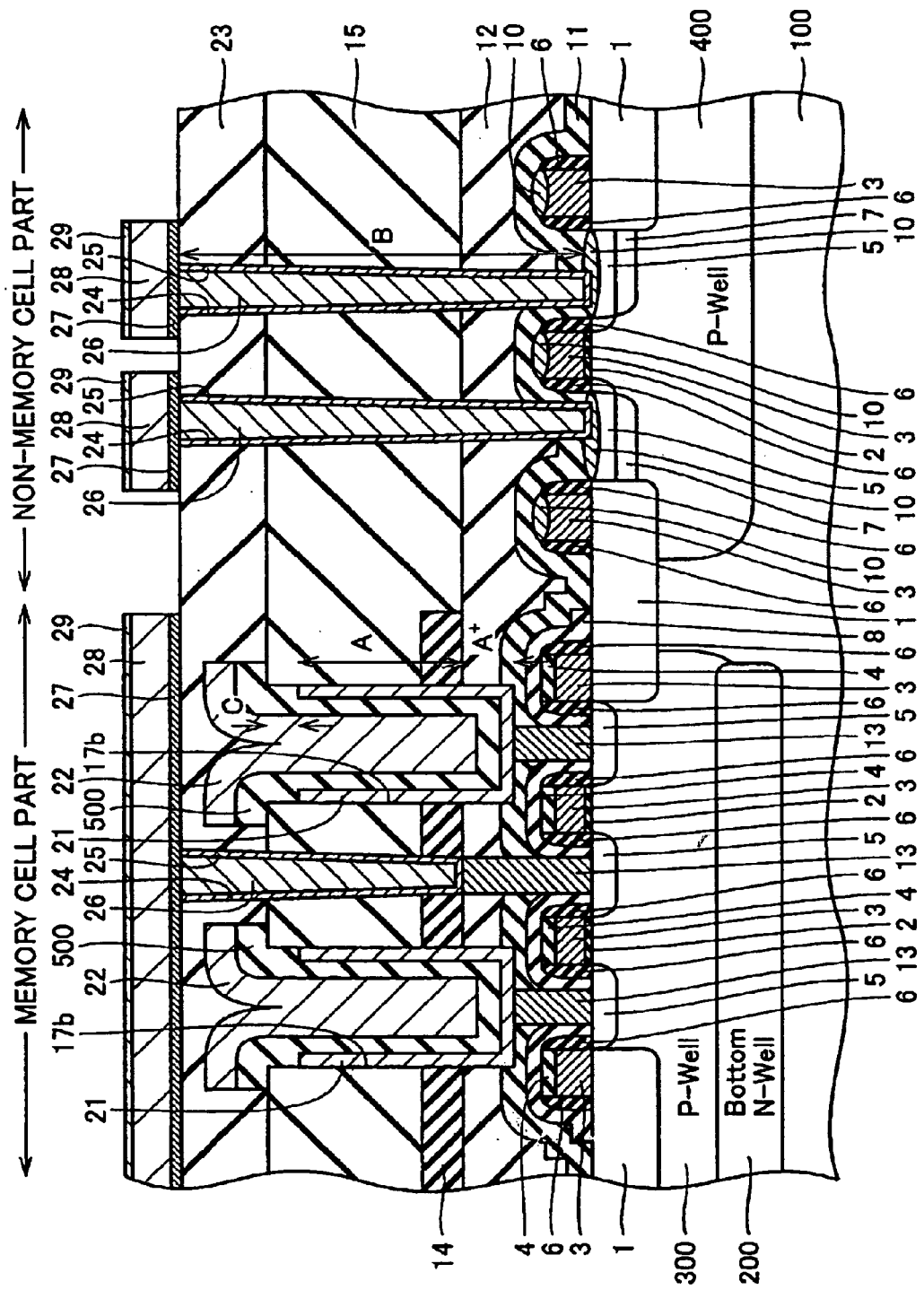
FIG. 1 is a diagram for illustrating the structure of a semiconductor device according to a first embodiment of the present invention.

Semiconductor devices according to embodiments of the present invention are now described with reference to the drawings.

First Embodiment

The structure of a semiconductor device according to a first embodiment of the present invention is described with reference to FIG. 1.

In the semiconductor device according to the first embodiment, a memory cell part and a non-memory cell part are provided on a semiconductor substrate 100. A bottom N well 200 is provided within semiconductor substrate 100 corresponding to the memory cell part. A P well 300 is provided in a space from the upper surface of the bottom N well 200 to the main surface of the semiconductor substrate 100.

A P well 400 is provided in a portion of the semiconductor substrate 100 corresponding to the non-memory cell part. Element isolation films 1 are provided in a prescribed depth from the main surface of the semiconductor substrate 100.

Transistors of the memory cell part are provided in the region formed with the P well 300. Transistors of the non-memory cell part are provided in the region formed with the P well 400. These transistors are formed by gate oxide films 2, gate electrodes 3 and source/drain regions 5 and 7.

Silicon oxide films 4 serving as etching masks are provided on the gate electrodes 3 of the transistors in the memory cell part. Low-resistance cobalt silicide films 10 are formed on the gate electrodes 3 and the source/drain regions 5 and 7 of the transistors in the non-memory cell part. Silicon nitride films 6 serving as side wall insulator films are formed on the side walls of gate oxide films 2 the gate electrodes 3 and the silicon oxide films 4.

A silicon oxide film 8 is formed to cover all gate electrodes 3 of the memory cell part. A silicon nitride film 11 serving as an etching stopper film is formed to cover the upper portion of the silicon oxide film 8 as well as the gate electrodes 3 of the non-memory cell part. A silicon oxide film 12 serving as an insulator film is formed on the silicon nitride film 11. A silicon nitride film 14 serving as an etching stopper film is formed on a portion of the silicon oxide film 12 corresponding to the memory cell part. A silicon oxide film 15 is formed to cover the silicon nitride film 14 and the silicon oxide film 12.

Cylindrical capacitor openings 17b extending perpendicularly to the main surface of the semiconductor substrate 100 are formed above the portion of the semiconductor substrate 100 corresponding to the memory cell part. The cylindrical capacitor openings 17b pass through the silicon oxide film 15, the silicon nitride film 14 and the silicon oxide film 12. In the cylindrical capacitor openings 17b, capacitor lower electrodes 21, capacitor dielectric films 500 and capacitor upper electrodes 22 are formed along the surfaces of the cylindrical capacitor openings 17b. The bottom surfaces of the cylindrical capacitor openings 17b are located below the main surface of the silicon nitride film 11.

A silicon oxide film 23 is formed on the silicon oxide film 15. Contact holes passing through the silicon oxide film 12 is formed on the source/drain regions 5 of the memory cell part, the silicon nitride film 11 and the silicon oxide film 8. Polycrystalline silicon plugs 13 are embedded in these contact holes. A contact hole 24 passing through the silicon oxide films 23 and 15 and the silicon nitride film 14 is formed on the central polycrystalline silicon plug 13. A barrier metal film 25 and a contact plug 26 are embedded in this contact hole 24.

Contact holes 24 passing through the silicon oxide films 23 and 15, the silicon nitride film 14, the silicon oxide film 12 and the silicon nitride film 11 are formed on the source/drain regions 5 and 7 of the non-memory cell part. Barrier metal films 25 and contact plugs 26 are formed in these contact holes 24.

Aluminum wiring layers 28 vertically held between titanium nitride films 27 and 29 are electrically connected to the upper surfaces of the contact plugs 26 independently of each other.

According to the aforementioned structure, the contact holes 24 of the non-memory cell part are not excellently formed themselves and cannot be excellently embedded unless the aspect ratio thereof is below a prescribed value. Therefore, the height of the contact holes 24 is limited below a prescribed value. In the memory cell part, therefore, the distance between the semiconductor substrate 100 and the aluminum wiring layer 28 held between the titanium nitride films 27 and 29 is limited.

According to the aforementioned structure, however, the cylindrical capacitor openings 17b pass through the silicon oxide film 15, the silicon nitride film 14 and the silicon oxide film 12 while the bottom surfaces of the cylindrical capacitor openings 17b are located below the main surface of the silicon nitride film 11. As compared with cylindrical capacitor openings having bottom surfaces located above the main surface of the silicon nitride film 14, therefore, the height of the cylindrical capacitor openings 17b extending perpendicularly to the main surface of the semiconductor substrate 100 between the semiconductor substrate 100 and the aluminum wiring layer 28 held between the titanium nitride films 27 and 29 in the memory cell part can be maximized. Consequently, the surface areas of the capacitor lower electrodes 21 formed along the surfaces of the cylindrical capacitor openings 17b can be maximized. Therefore, the capacitances of the capacitors can be maximized.

A method of fabricating the semiconductor device according to the first embodiment is now described with reference to FIGS. 2 to 13.

Figure 2:
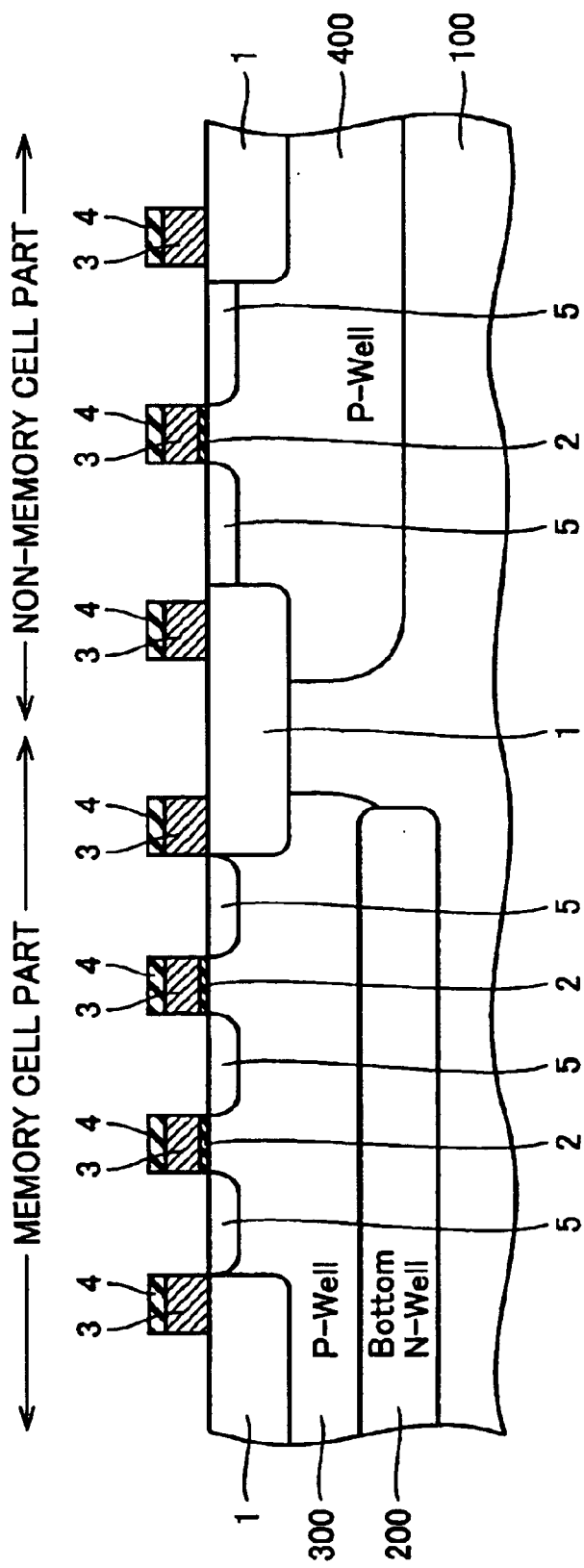
FIGS. 2 to 13 are diagrams for illustrating a method of fabricating the semiconductor device according to the first embodiment.

In order to fabricate the semiconductor device according to this embodiment, fabrication steps for a general EDRAM (Embedded Dynamic Random Access Memory) are carried out for obtaining the structure shown in FIG. 2. In order to obtain the structure shown in FIG. 2, the element isolation films 1 for isolating element forming regions from each other are formed in the prescribed depth from the semiconductor substrate 100. Thereafter the bottom N well 200 is formed in the portion of the semiconductor substrate 100 corresponding to the memory cell part. Then, the P well 300 is formed on the bottom N well 200.

The P well 400 is formed in the portion of the semiconductor substrate 100 corresponding to the non-memory cell part. An impurity is implanted into regions for forming channel regions of the transistors. Thereafter an oxide film for defining the gate oxide films 2 is formed on the surface of the semiconductor substrate 100.

A polycrystalline silicon film for configuring the gate electrodes 3 is formed on the oxide film. The silicon oxide films 4 of TEOS (Tetra Ethyl Ortho Silicate) employed as etching masks for forming the gate electrodes 3 are formed on the polycrystalline silicon film.

The aforementioned oxide film and the aforementioned polycrystalline silicon film are etched through the silicon oxide films 4 serving as etching masks, thereby forming the gate oxide films 2 and the gate electrodes 3. Thereafter an impurity is implanted up to a prescribed depth from the main surface of the semiconductor substrate 100, thereby forming the source/drain regions 5. Thus, the structure shown in FIG. 2 is obtained.

Figure 3:
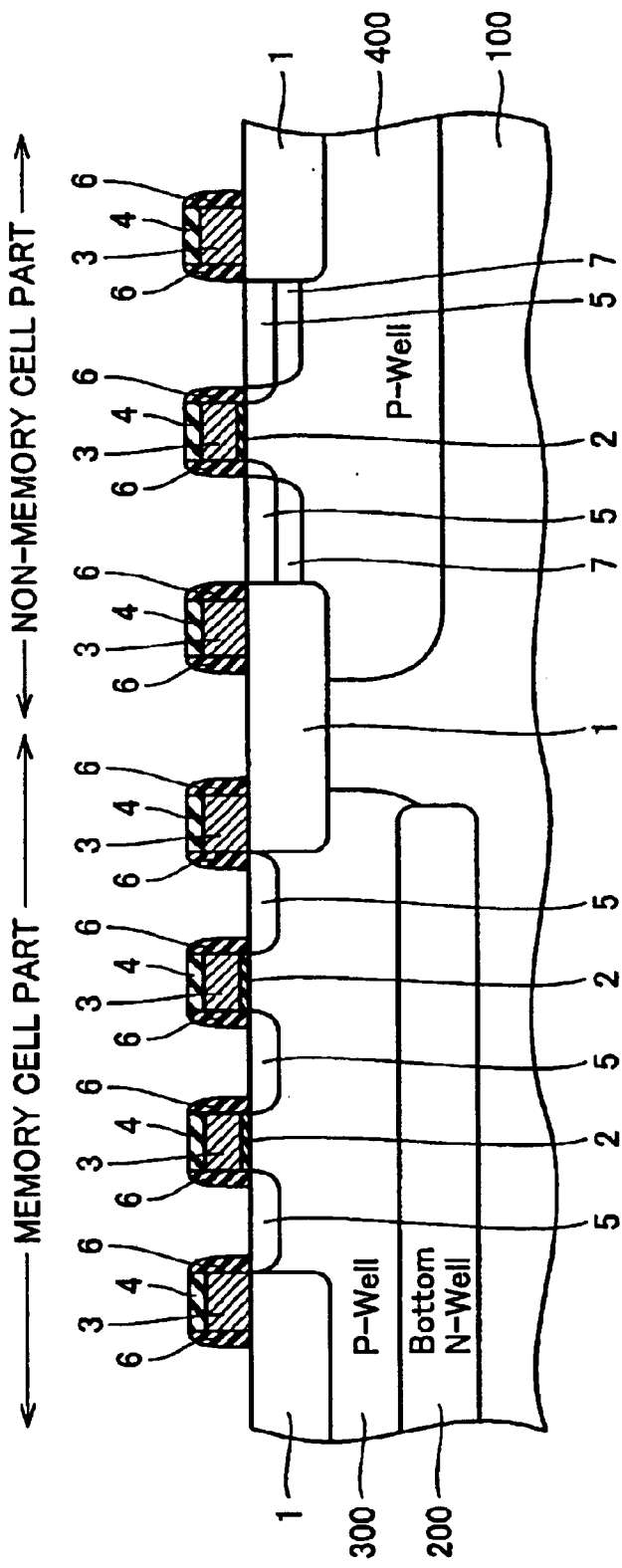

Then, a silicon nitride film is formed to cover the semiconductor substrate 100, the gate electrodes 3, the silicon oxide films 4 and the source/drain regions 5. This silicon nitride film is anisotropically etched thereby forming the silicon nitride films 6 for serving as side wall spacers on the side walls of the gate electrodes 3 and the silicon oxide films 4. Further, an impurity is implanted into the source/drain regions 5 of the non-memory cell part. Thus, the structure shown in FIG. 3 is obtained.

Then, the silicon oxide film 8 consisting of undoped silicate glass (hereinafter abbreviated as "USG") resistant against cobalt silicification to form silicide is formed to cover the source/drain regions 5, the silicon nitride films 6 and the silicon oxide films 4.

Figure 4:
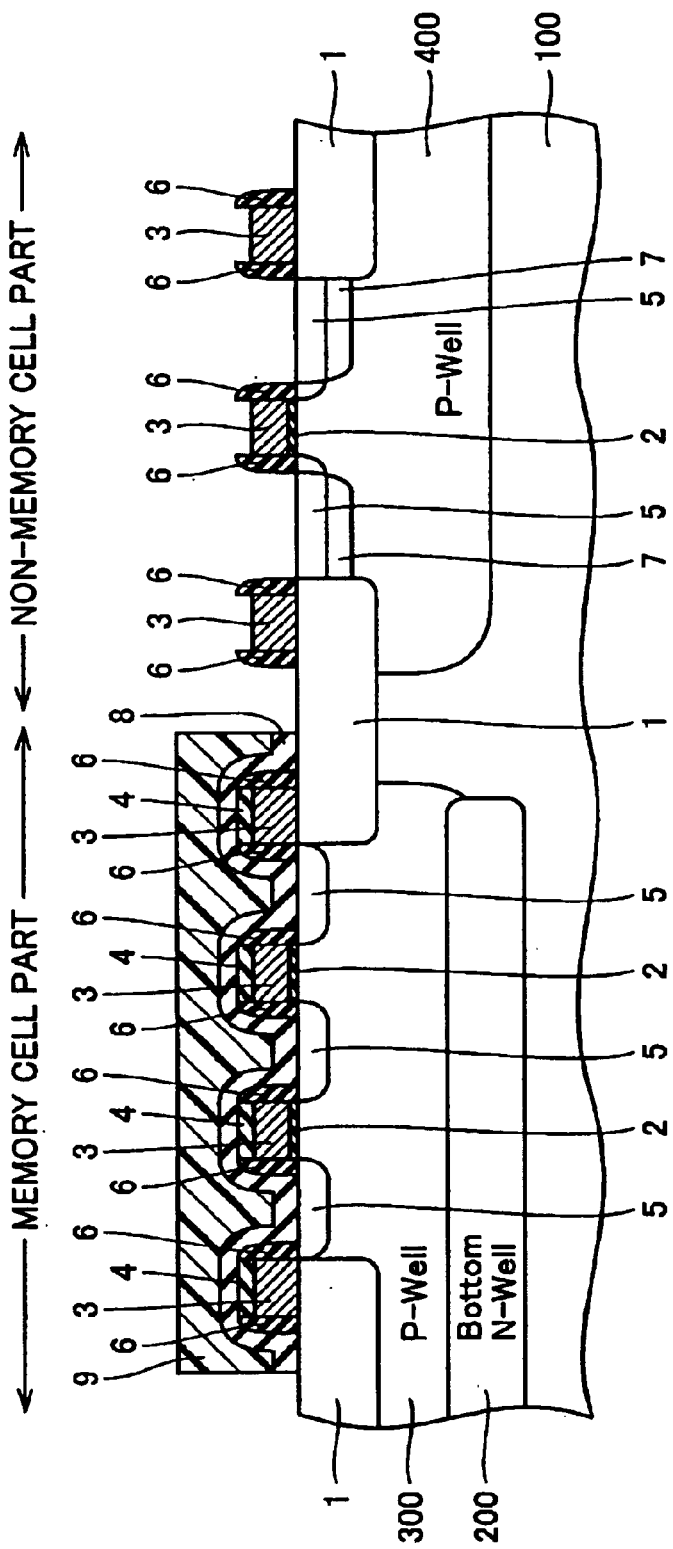

Then, a prescribed resist pattern 9 is formed on the silicon oxide film 8. This resist pattern 9 is employed as a mask for performing etching, thereby removing the silicon oxide films 4 from parts of the silicon oxide film 8 and the gate electrodes 3 at least in the non-memory cell part. Thus, the structure shown in FIG. 4 is obtained.

Figure 5:
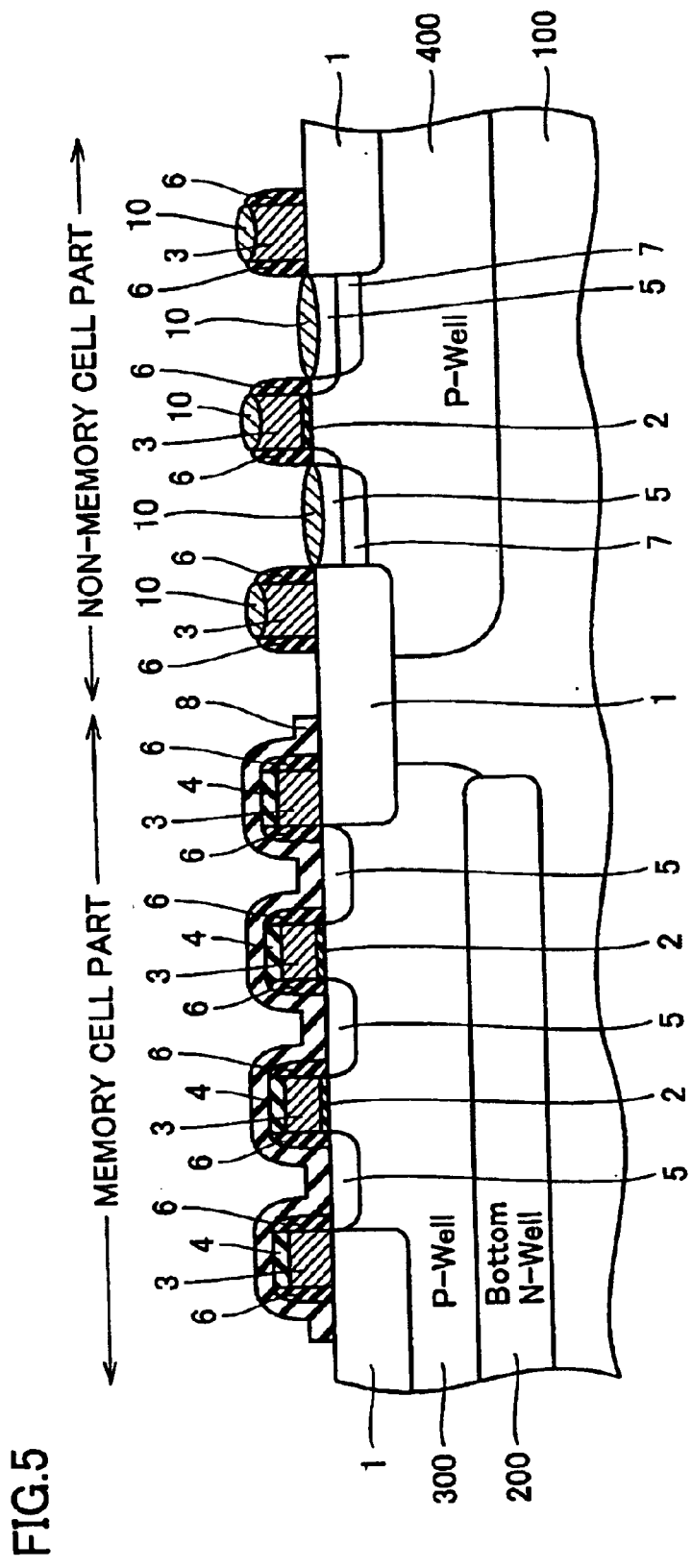

Then, a cobalt film is formed by cobalt sputtering to cover the overall portion of the semiconductor substrate 100 corresponding to the non-memory cell part. Thereafter heat treatment such as lamp annealing is performed, thereby forming the low-resistance cobalt silicide films 10 on the source/drain regions 5 and the gate electrodes 3 of the non-memory cell part. Consequently, the structure shown in FIG. 5 is obtained.

Figure 6:
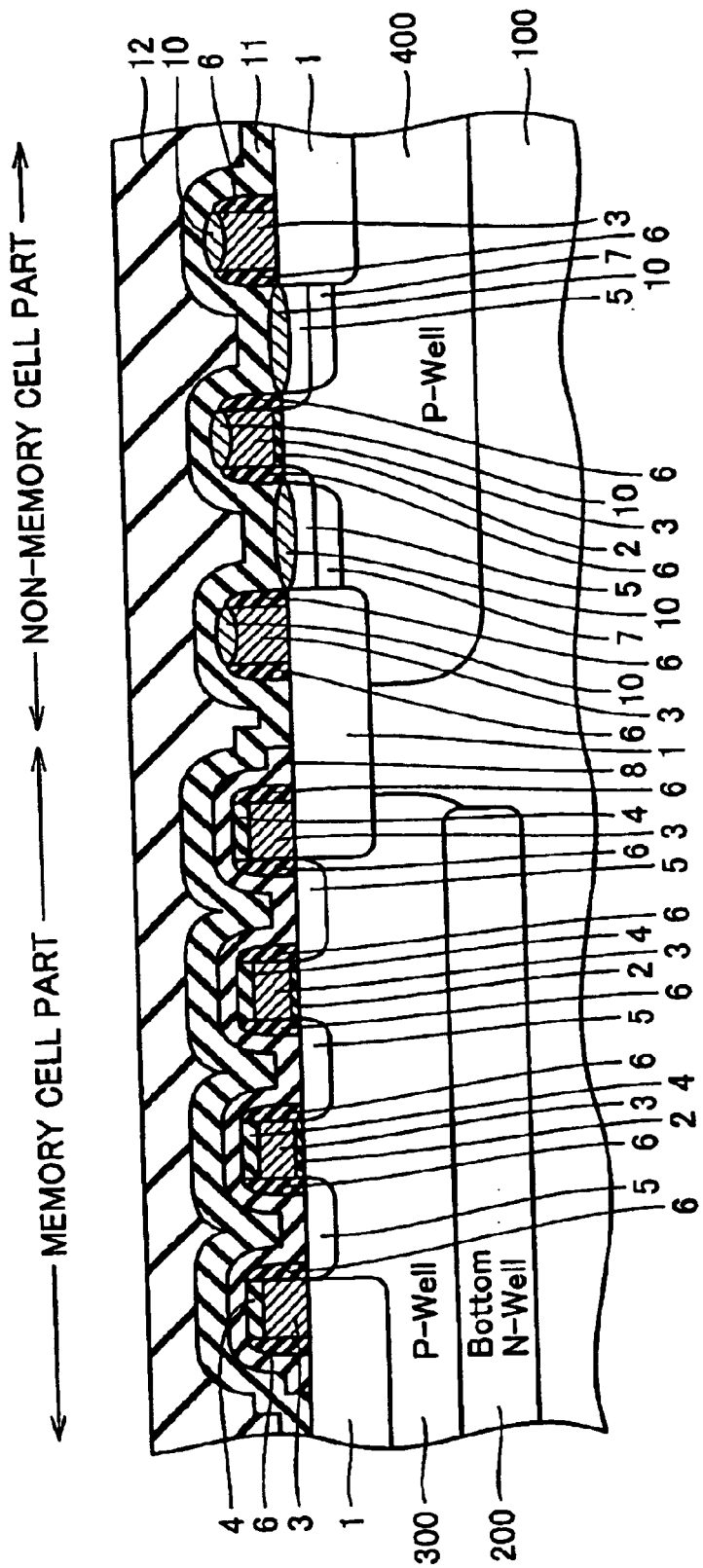

Thereafter the silicon nitride film 11 serving as an etching stopper film for protecting the non-memory cell part in a subsequent step of opening the contact holes is formed to cover the overall upper portion of the semiconductor substrate 100. The silicon oxide film 12 consisting of BPTEOS (Boro-Phospho Tetra Ethyl Ortho Silicate) or USG is stacked on the silicon nitride film 11. Thereafter the surface of the silicon oxide film 12 is flattened by heat treatment or CMP (Chemical Mechanical Polishing). Thus, the structure shown in FIG. 6 is obtained.

Figure 7:
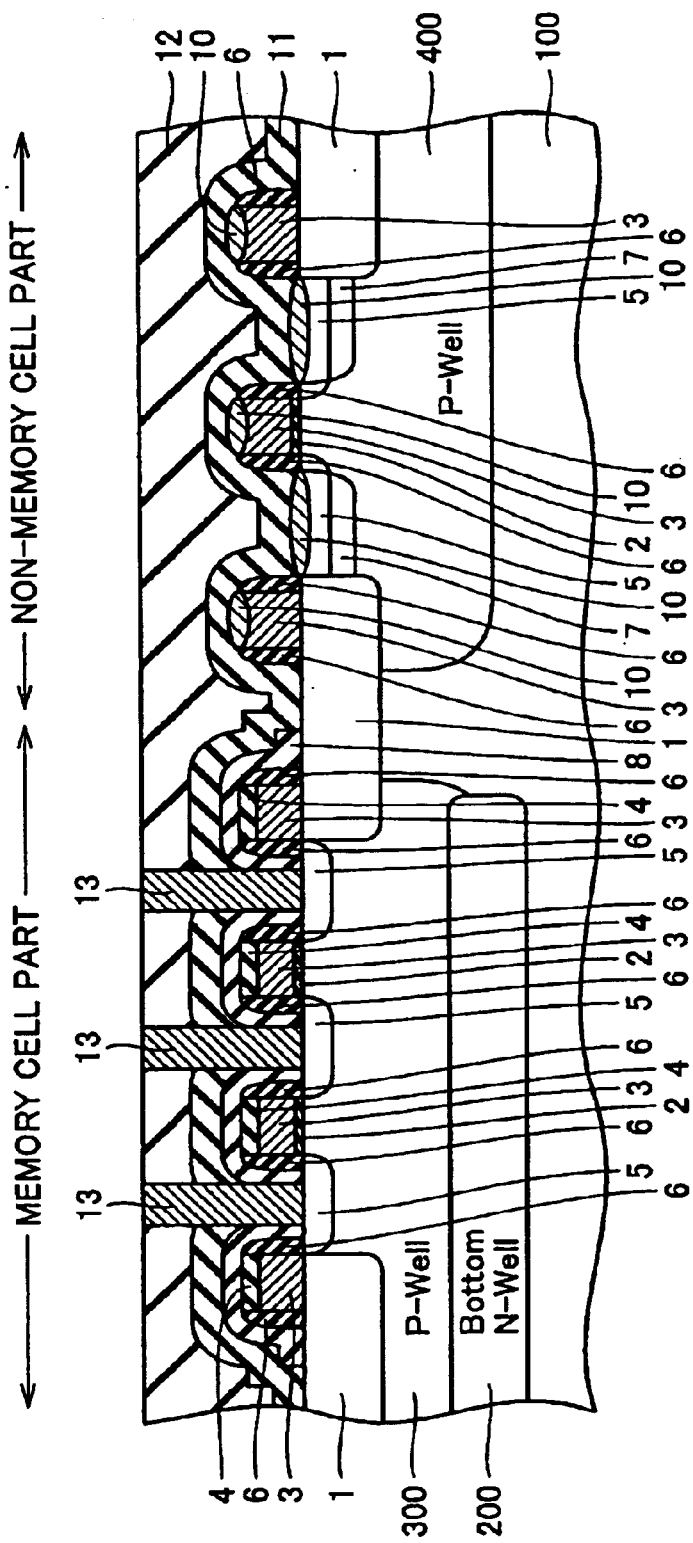

Then, the contact holes reaching the surface of the semiconductor substrate 100 are formed between the gate electrodes 3 of the memory cell part. These contact holes are filled up with polycrystalline silicon, thereby forming the polycrystalline silicon plugs 13. Thus, the structure shown in FIG. 7 is obtained.

Figure 8:
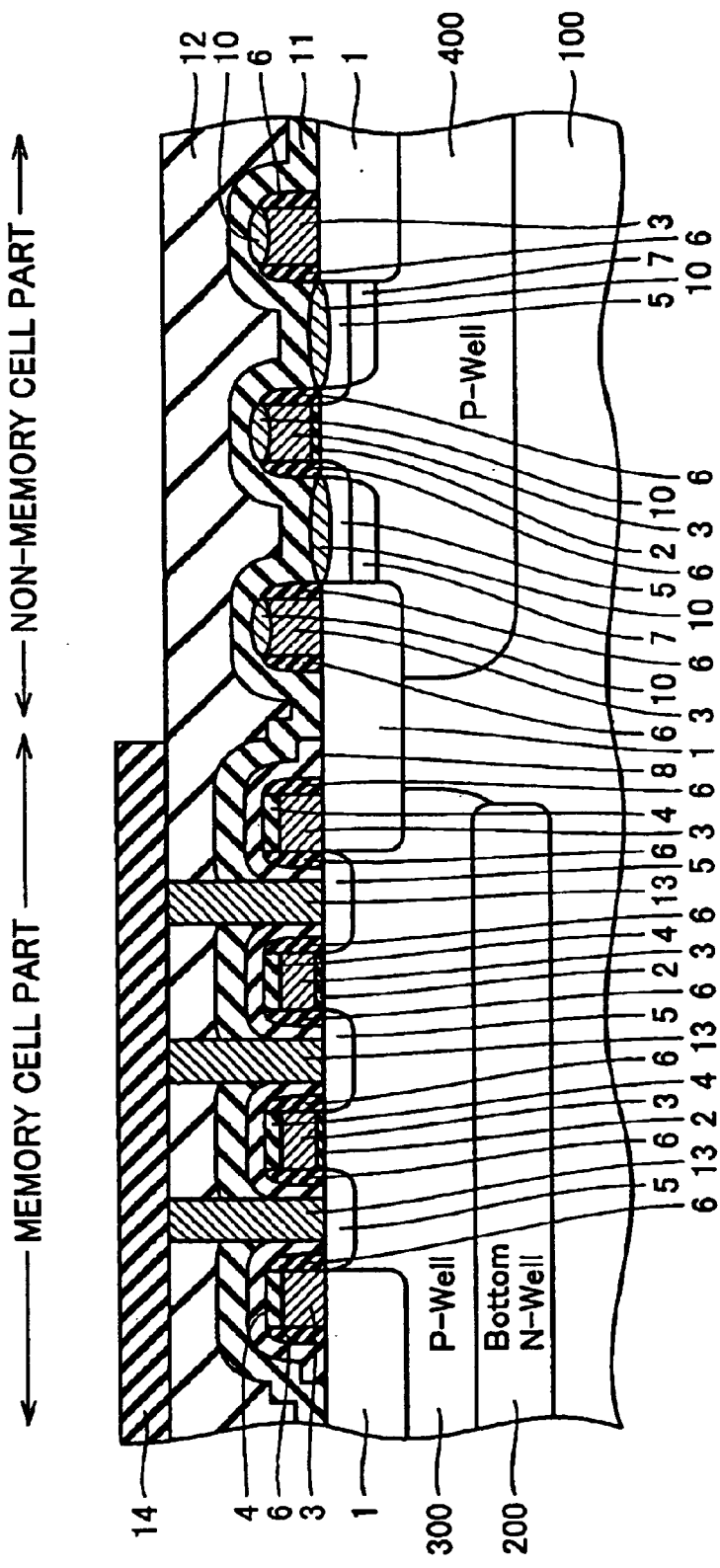

Then, the silicon nitride film 14 is formed to cover the surface of the portion of the silicon oxide film 12 corresponding to the memory cell part and the surfaces of the polycrystalline silicon plugs 13, for serving as an etching stopper film in a subsequent step of forming the contact holes 24. Thus, the structure shown in FIG. 8 is obtained.

Then, the silicon oxide film 15 consisting of BPTEOS, USG or PSG (Phospho-doped Silicate Glass) is stacked to cover the silicon oxide film 12 and the silicon nitride film 14. Thereafter the surface of the silicon oxide film 15 is flattened. Then, a photoresist pattern 16 is formed on the silicon oxide film 15.

This photoresist pattern 16 is employed as a mask for performing dry etching, thereby forming the cylindrical capacitor openings 17b to pass through the silicon oxide film 15, the silicon nitride film 14 and the silicon oxide film 12 and partially remove the silicon nitride film 11 up to a prescribed depth from the main surface thereof. Thus, the structure shown in FIG. 9 is obtained.

Figure 9:
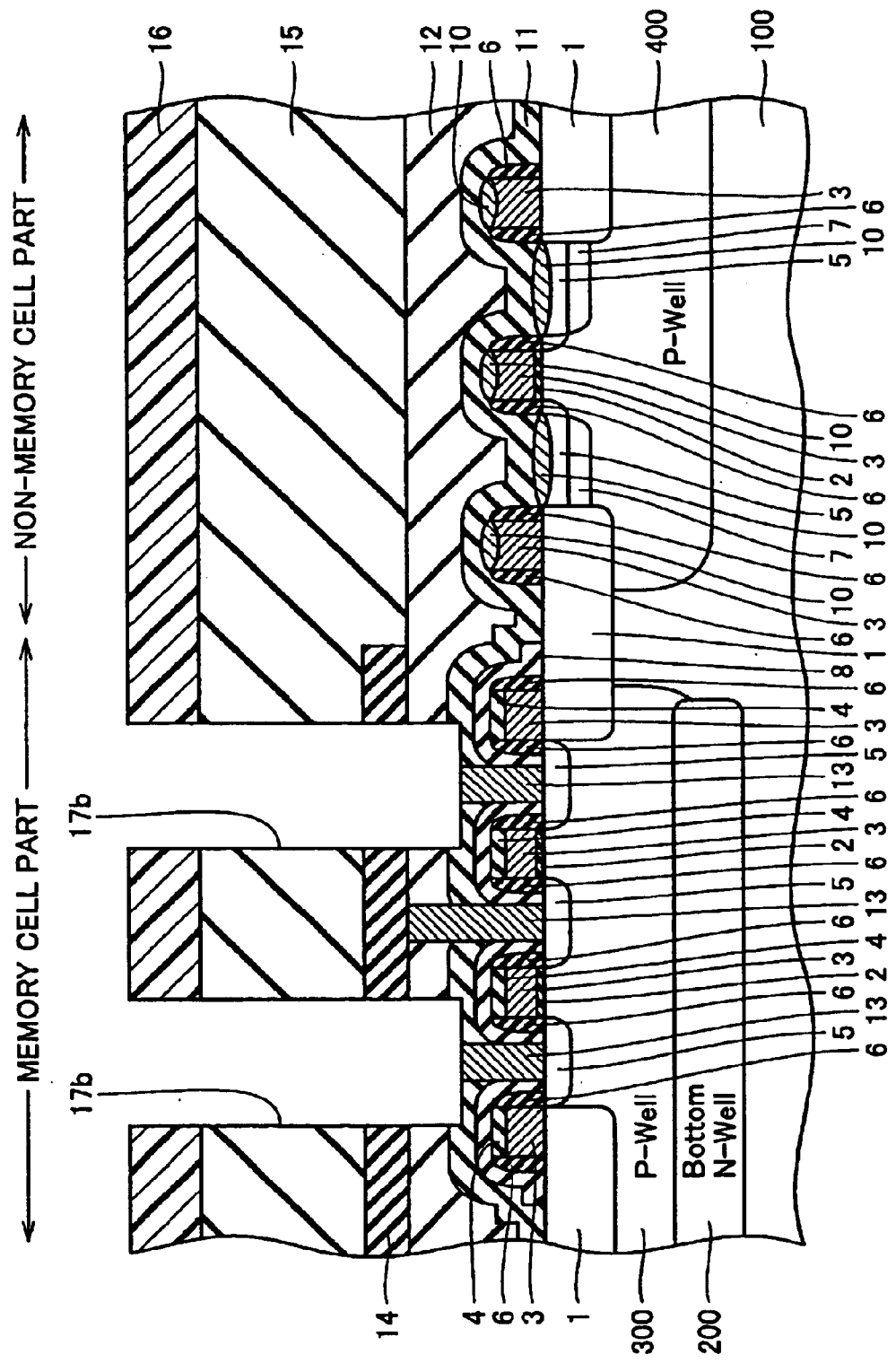

The structure shown in FIG. 9 can be formed by improving the selection ratio of the silicon oxide films 15 and 12 or the silicon nitride film 14 with respect to resist in the dry etching.

Polycrystalline silicon films doped with phosphorus and amorphous silicon films doped with no impurities are sequentially formed on the surfaces of the cylindrical capacitor openings 17b for configuring the capacitor lower electrodes 21. Thereafter the surface areas of the amorphous silicon films are increased by surface treatment.

Figure 10:
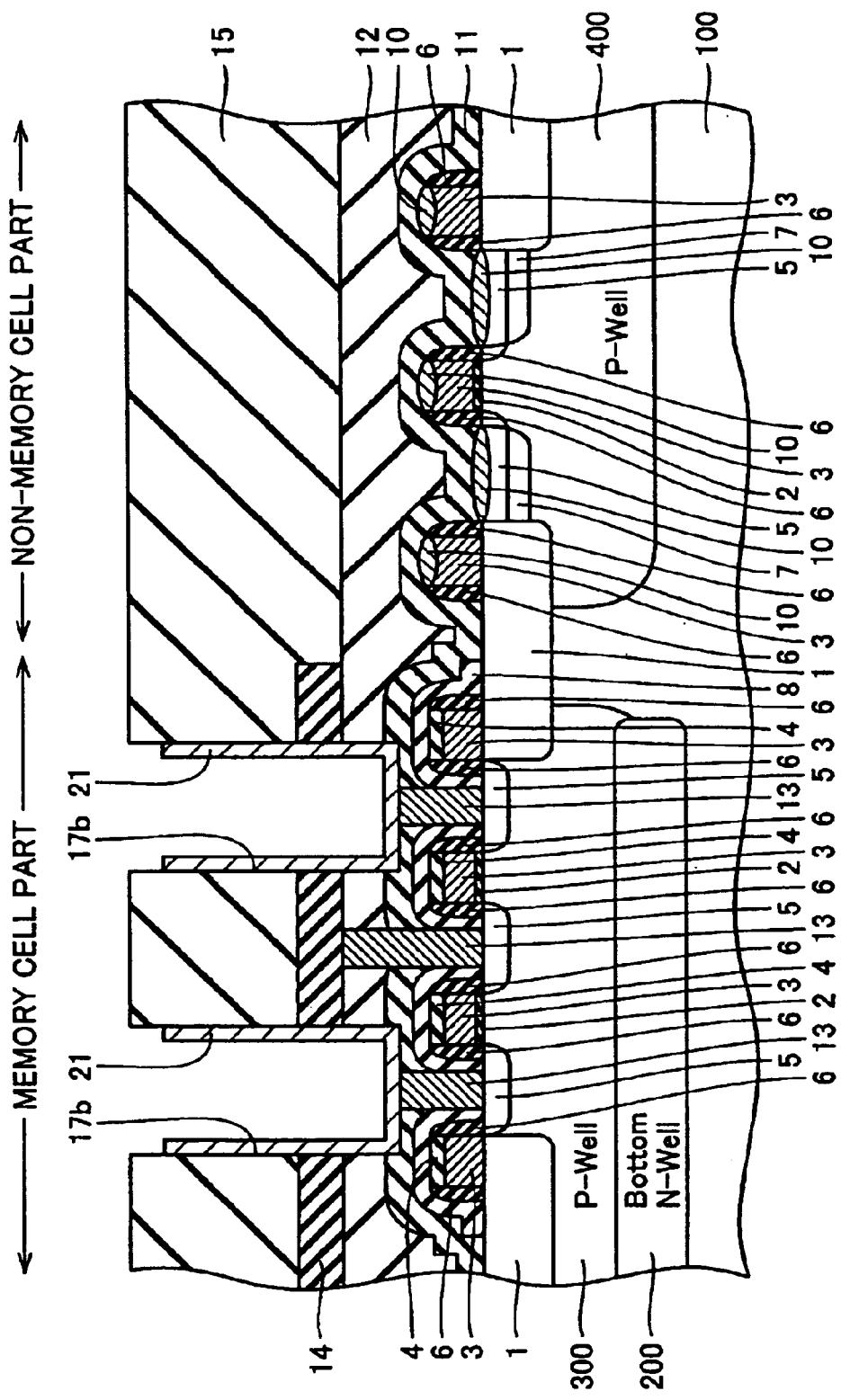
Figure 11:
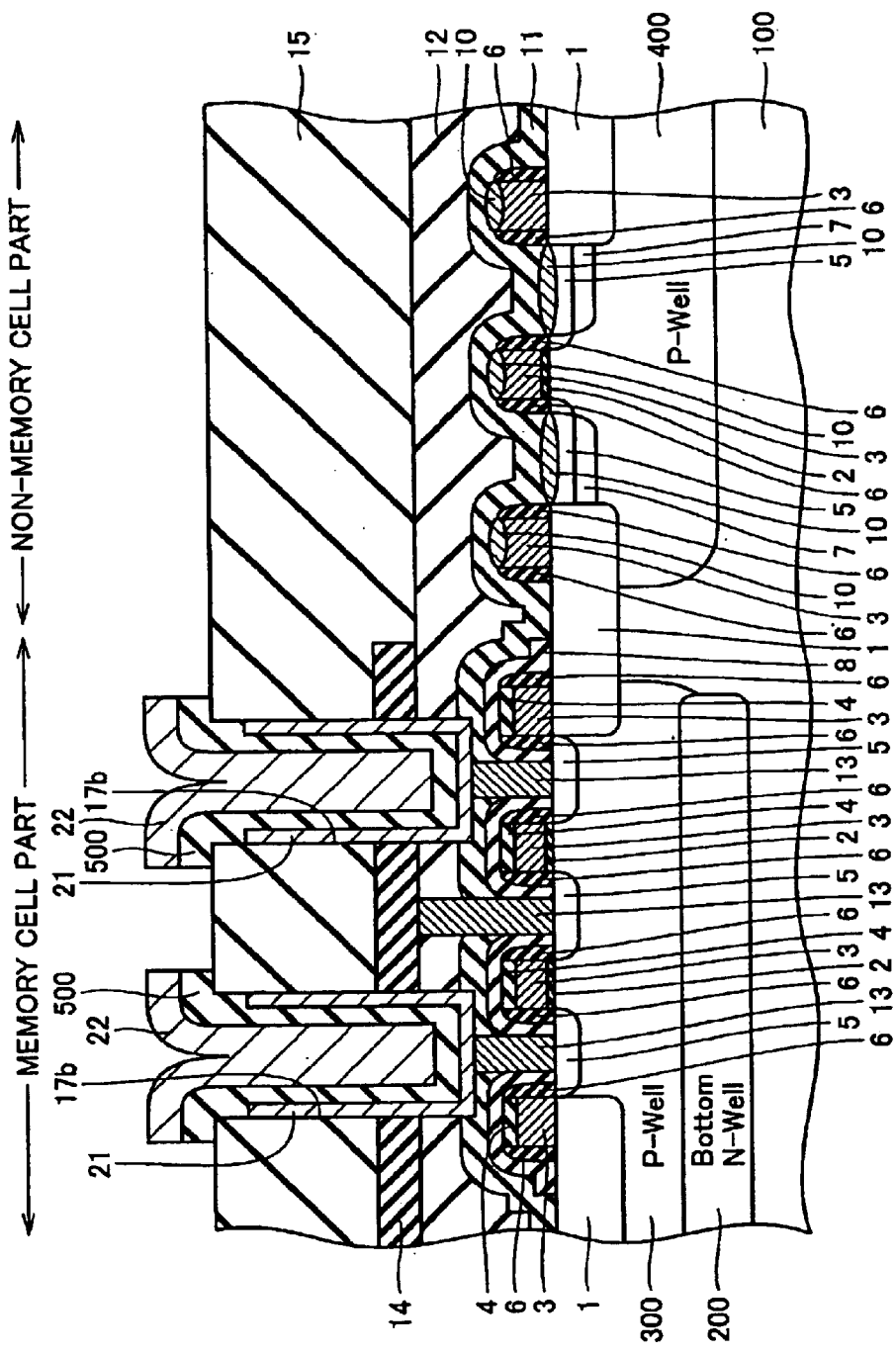

Then, the polycrystalline silicon films and the amorphous silicon films formed in the cylindrical capacitor openings 17b are covered with photoresist films and anisotropically etching through the photoresist films serving as masks. Thus, the polycrystalline silicon films and the amorphous silicon films remain only on the surfaces of the cylindrical capacitor openings 17b, for forming the capacitor lower electrodes 21 as shown in FIG. 10.

Then, tantalum pentoxide films for configuring the capacitor dielectric films 500 are formed on the surfaces of the capacitor lower electrodes 21 and the silicon oxide film 15. Then, films containing titanium nitride for configuring the capacitor upper electrodes 22 are formed on the tantalum pentoxide films. Thereafter patterning is performed with photoresist, thereby obtaining the structure shown in FIG. 11. Consequently, the capacitors are completed.

Figure 12:
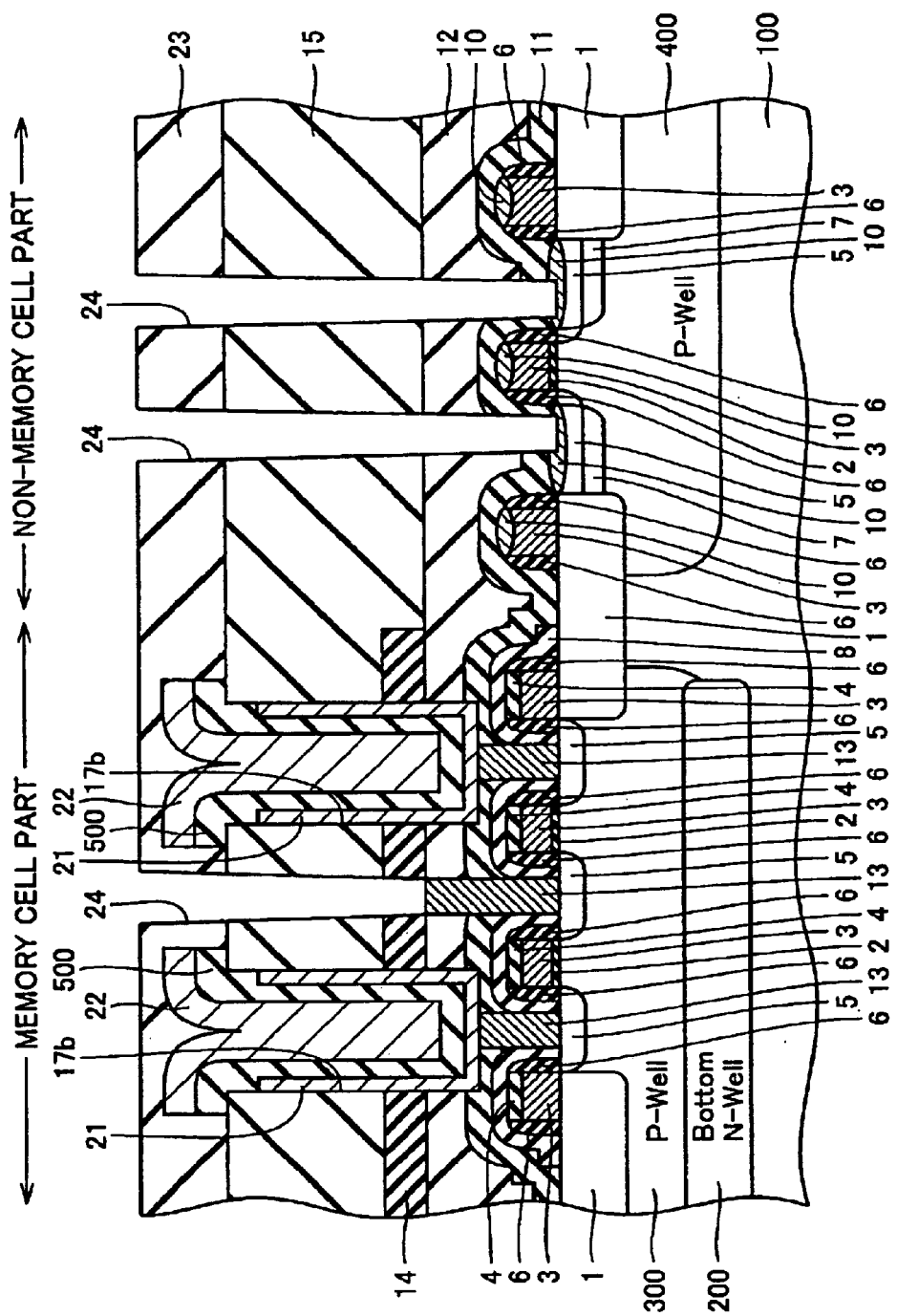

The silicon oxide film 23 of plasma TEOS or USG is formed on the capacitor upper electrodes 22. Thereafter the surface of the silicon oxide film 23 is flattened by CMP. Then, the contact holes 24 are formed to reach the central polycrystalline silicon plug 13, a central gate electrode 3 (not shown) and a central capacitor upper electrode 22 (not shown) of the memory cell part and portions of the low-resistance cobalt silicide film 10 located on the source/drain regions 5 and 7 of the non-memory cell part and the gate electrodes 3 (not shown) thereof. Thus, the structure shown in FIG. 12 is obtained.

At this time, etching is performed in two stages for forming the contact holes 24. In the first stage, the etching is completed when the bottom surfaces of the contact holes 24 are located in the portions of the silicon nitride films 14 and 11 corresponding to the memory cell part and the non-memory cell part respectively. In the second stage, the contact holes 24 pass through the silicon nitride films 14 and 11 respectively for exposing the surface of the central polycrystalline silicon plug 13 and the portions of the low-resistance cobalt silicide film 10 located on the source/drain regions 5 and 7.

Figure 13:
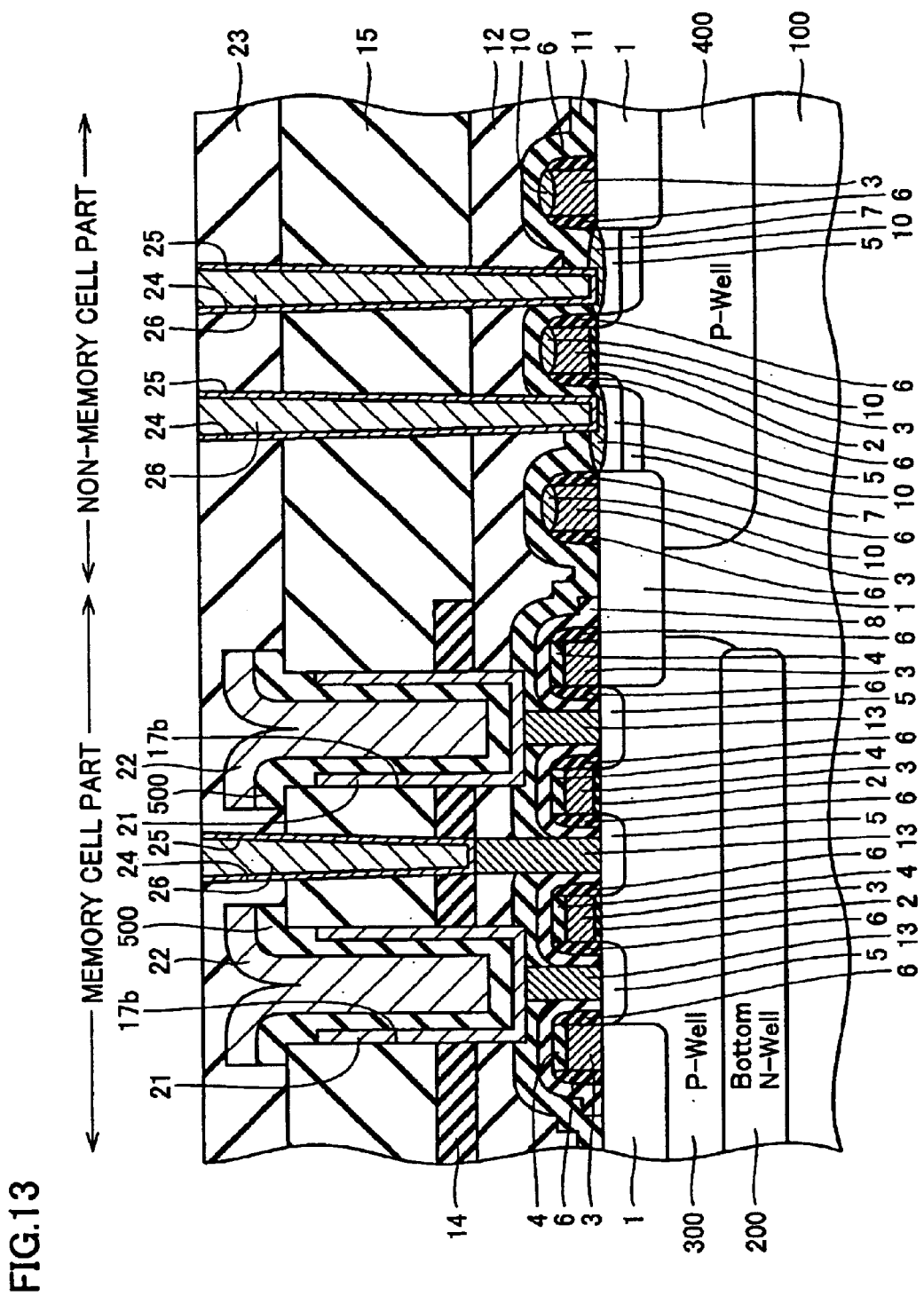

Thereafter the contact holes 24 are sequentially filled with titanium nitride films for forming the barrier metal films 25 and tungsten films for forming the contact plugs 26. Thus, the structure shown in FIG. 13 is obtained. Thereafter the aluminum wiring layers 28 vertically held between the titanium nitride films 27 and 29 are formed to be in contact with the upper surfaces of the tungsten films. Thus, the structure shown in FIG. 1 is obtained.

In the aforementioned method of fabricating the semiconductor device according to the first embodiment, the height of the capacitor lower electrodes 21 can be increased by a value $A^+$ without increasing the height B of the contact plugs 26 in the non-memory cell part. Therefore, the semiconductor device is improved in refreshability and soft error resistance.

The process of forming the cylindrical capacitor openings 17b in the aforementioned semiconductor device according to the first embodiment has the following effect: In general, the photoresist pattern 16 shown in FIG. 9 is employed as a mask for forming openings in the silicon oxide film 15 and thereafter removed, and the silicon oxide film 15 is thereafter employed as a mask for partially removing the silicon nitride film 14 through complicated steps. In the method of fabricating the semiconductor device according to the first embodiment, however, the photoresist pattern 16 is employed as a mask for simultaneously partially removing the silicon nitride film 11, the silicon oxide film 12, the silicon nitride film 14, the silicon oxide film 15 and the polycrystalline silicon plugs 13 as shown in FIG. 9, whereby the number of steps can be remarkably reduced.

Second Embodiment

The structure of a semiconductor device according to a second embodiment of the present invention is now described with reference to FIG. 14.

Figure 14:
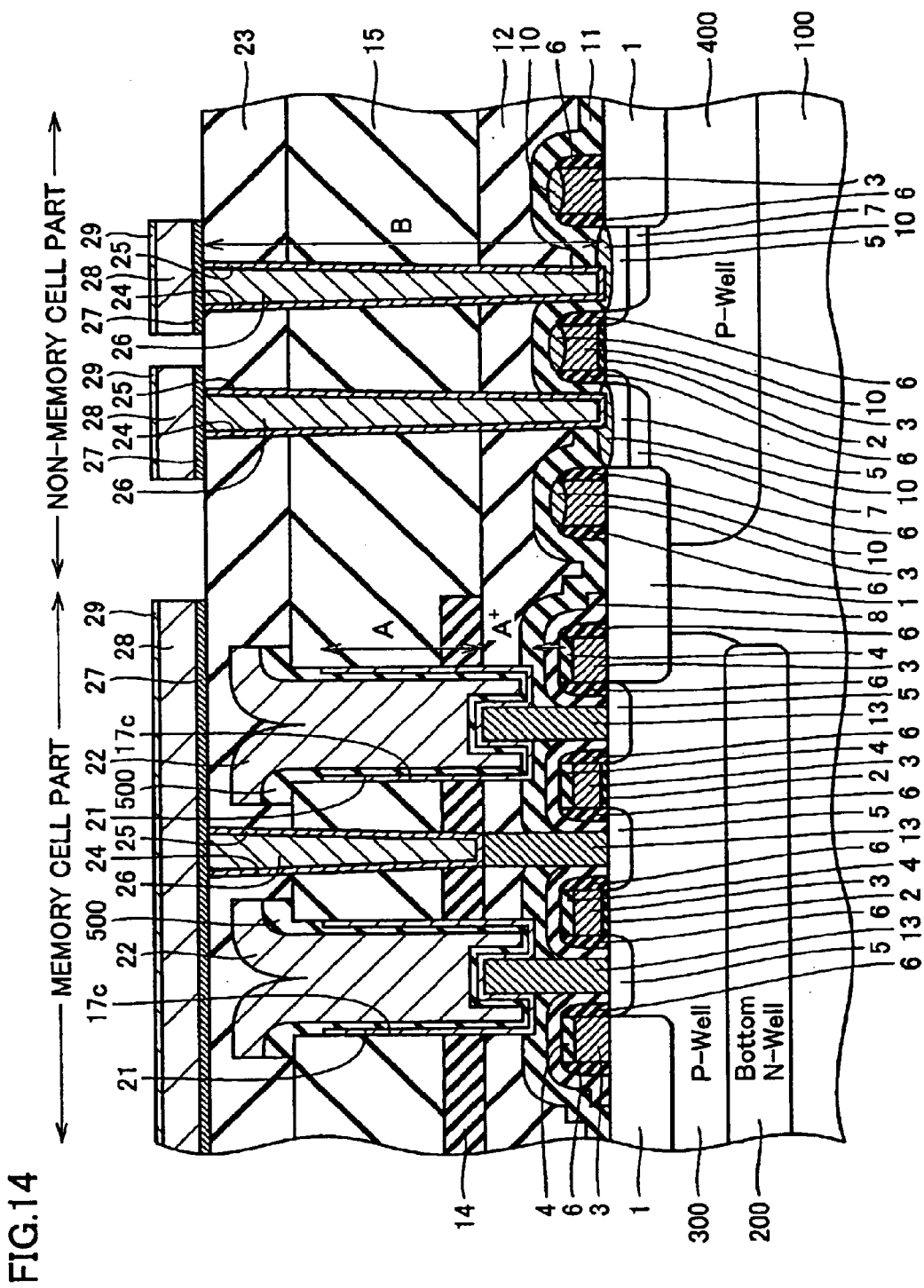
FIG. 14 is a diagram for illustrating the structure of a semiconductor device according to a second embodiment of the present invention.

The structure of the semiconductor device according to the second embodiment is substantially similar to that of the semiconductor device according to the first embodiment shown in FIG. 1, except that polycrystalline silicon plugs 13 connected to capacitor lower electrodes 21 pass through a silicon nitride film 11 to upwardly project beyond the surface of the silicon nitride film 11, as shown in FIG. 14.

According to the aforementioned structure of this semiconductor device, the surface areas of the capacitor lower electrodes 21 can be increased due to the portions of the polycrystalline silicon plugs 13, connected to the capacitor lower electrodes 21, upwardly projecting beyond the surface of the silicon nitride film 11. Consequently, the capacitances of capacitors can be more increased according to this structure of the semiconductor device as compared with the structure of the semiconductor device according to the first embodiment.

A method of fabricating the semiconductor device according to the second embodiment is now described with reference to FIGS. 15 to 19. In the method of fabricating the semiconductor device according to the second embodiment, a structure similar to that shown in FIG. 8 is prepared through a process similar to that for the semiconductor device according to the first embodiment.

Then, a silicon oxide film 15 of BPTEOS, USG or PSG is stacked to cover a silicon oxide film 12 and a silicon nitride film 14. Thereafter the surface of the silicon oxide film 15 is flattened. Then, a photoresist pattern 16 is formed on the silicon oxide film 15.

This photoresist pattern 16 is employed as a mask for performing dry etching, thereby forming cylindrical capacitor openings 17c to pass through the silicon oxide film 15, the silicon nitride film 14 and the silicon oxide film 12 while partially removing the silicon nitride film 11 up to a prescribed depth from the main surface thereof. Thus, the structure shown in FIG. 15 is obtained.

Figure 15:
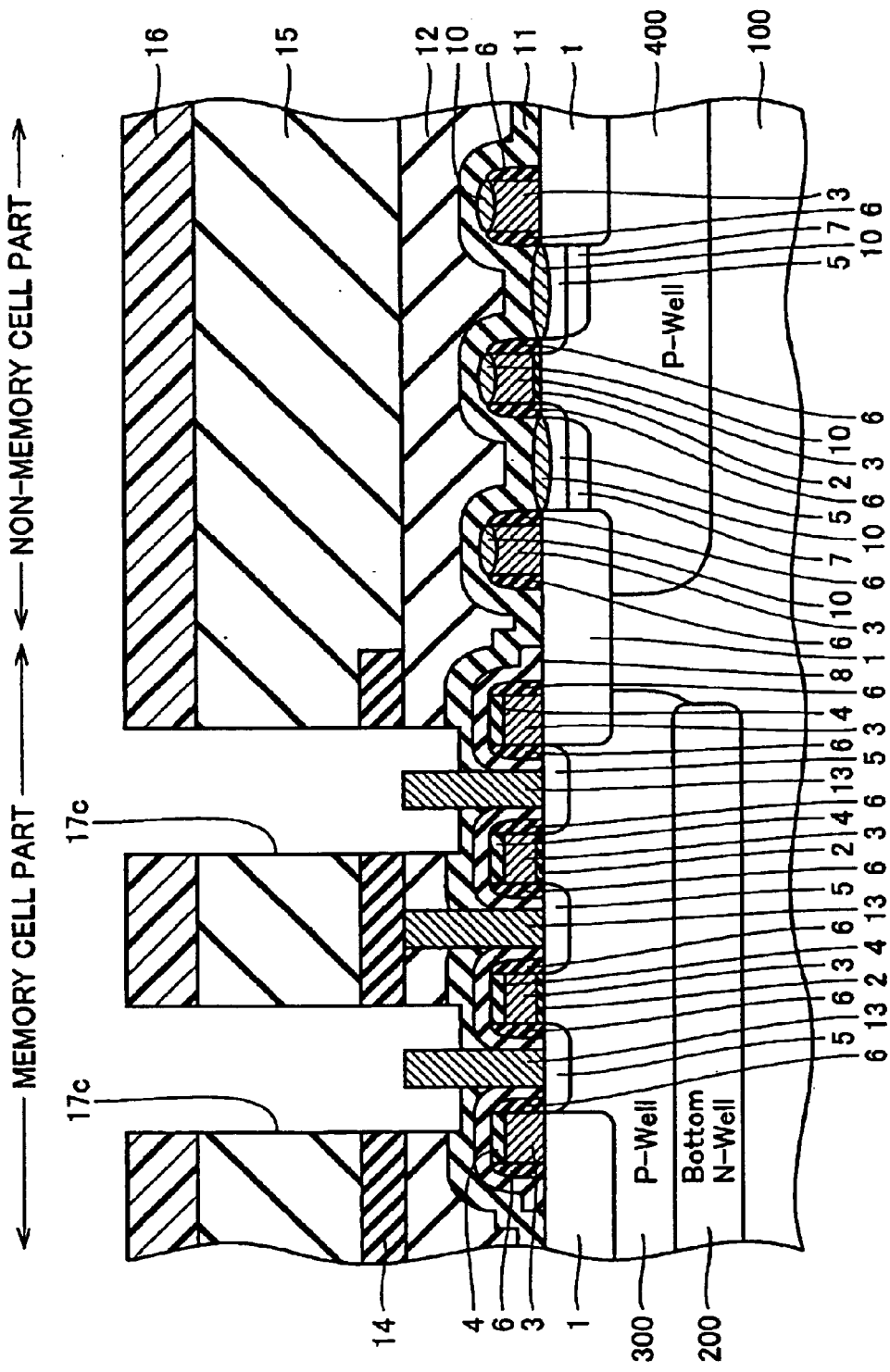
FIGS. 15 to 19 are diagrams for illustrating a method of fabricating the semiconductor device according to the second embodiment.

The method of fabricating the semiconductor device according to the second embodiment is different from that for the semiconductor device according to the first embodiment in a point that the cylindrical capacitor openings 17c are so formed that the polycrystalline silicon plugs 13 upwardly project from the bottom surfaces of the cylindrical capacitor openings 17c, as shown in FIG. 15. Therefore, the capacitances of the capacitors in the semiconductor device according to the second embodiment are further increased as compared with those in the semiconductor device according to the first embodiment. The aforementioned step is carried out with an etchant etching only the silicon oxide films 15 and 12 and the silicon nitride film 14 while leaving the polycrystalline silicon plugs 13 intact.

Then, polycrystalline silicon films doped with phosphorus and amorphous silicon films doped with no impurities are formed on the surfaces of the cylindrical capacitor openings 17c, for defining the capacitor lower electrodes 21. Thereafter the surface areas of the amorphous silicon films are increased by surface treatment. Then, the polycrystalline silicon films and the amorphous silicon films formed in the cylindrical capacitor openings 17c are covered with photoresist films.

Figure 16:
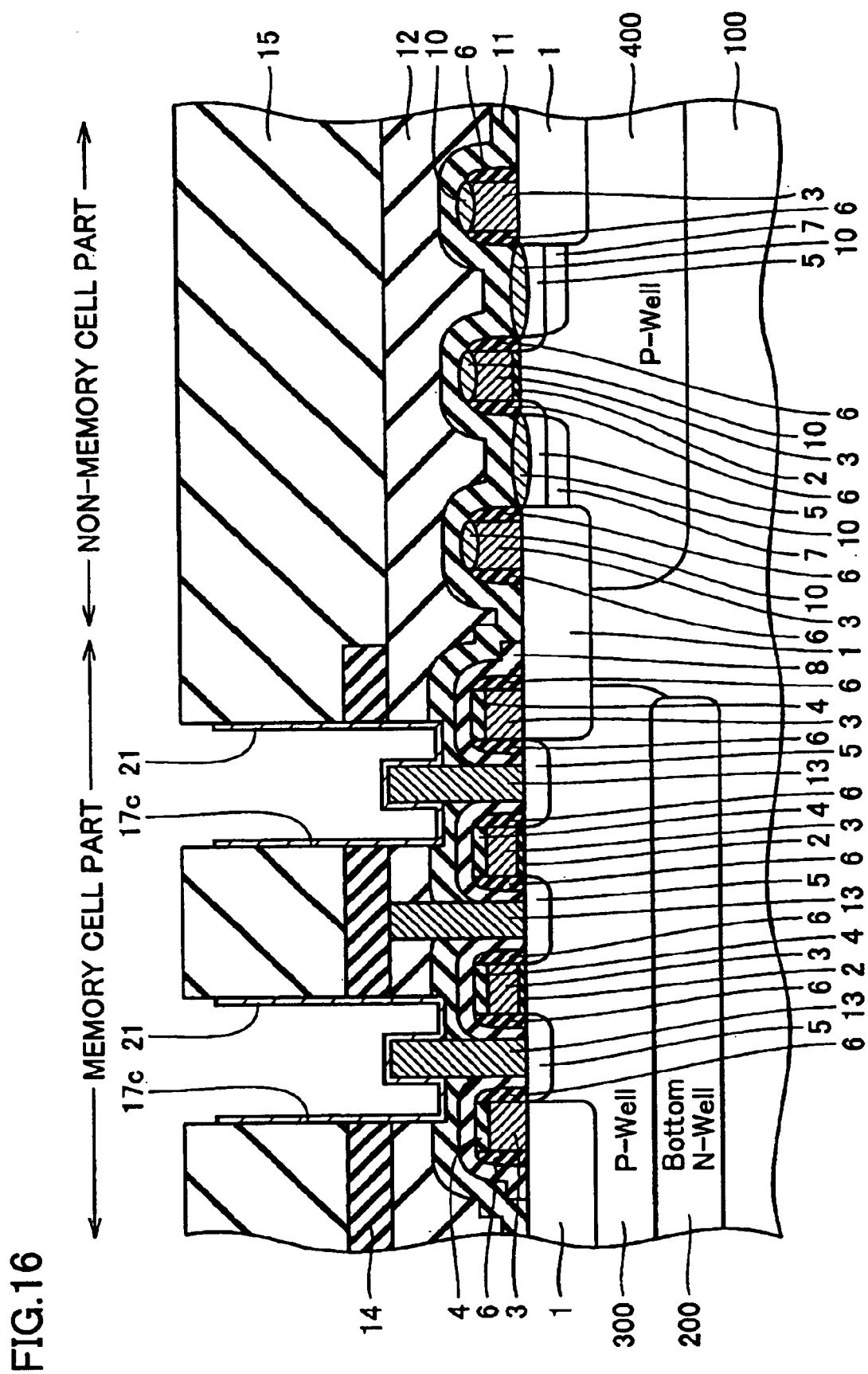
Figure 17:
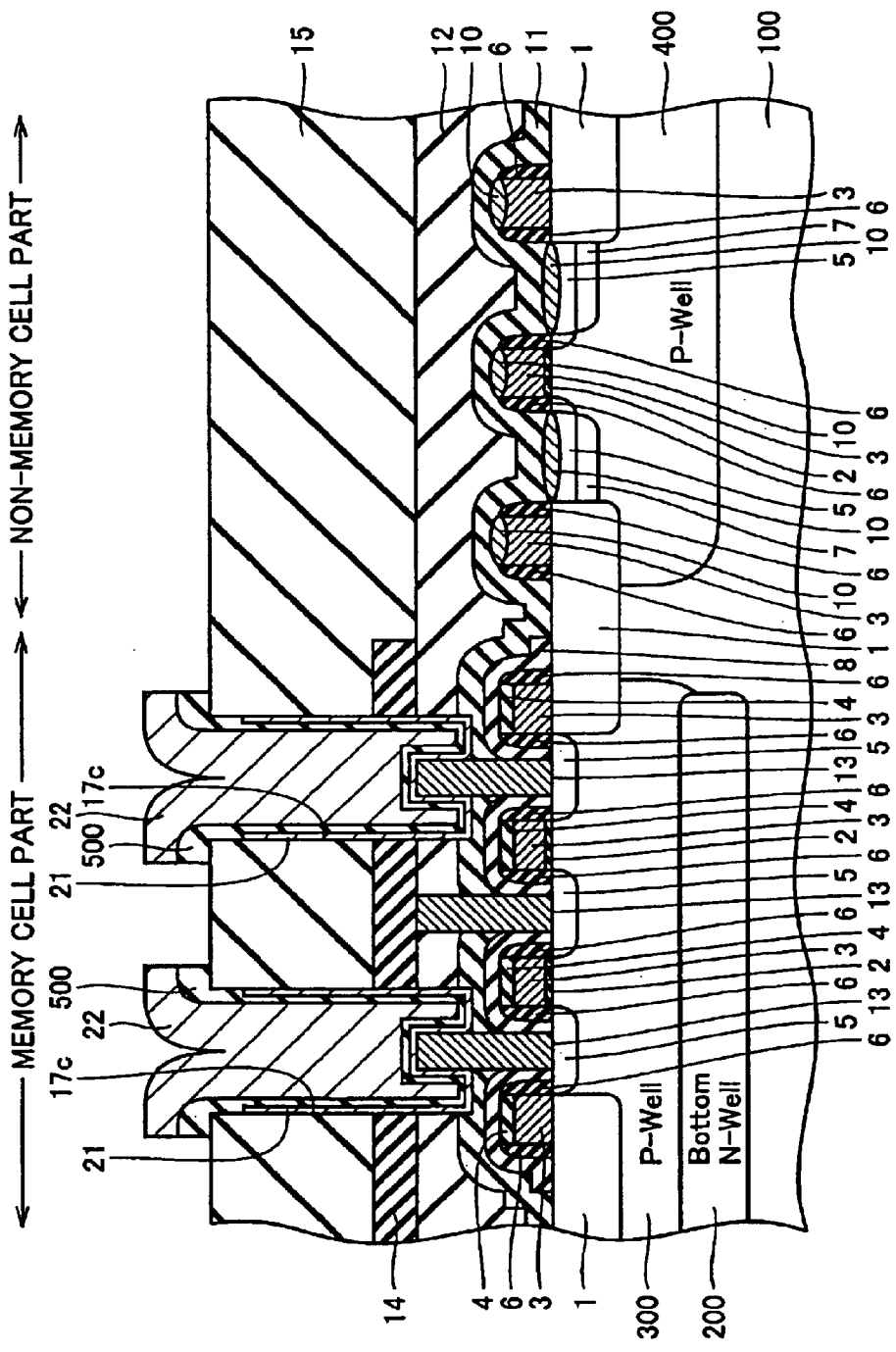

These photoresist films are employed as masks for anisotropically etching the polycrystalline silicon films and the amorphous silicon films. Thus, the polycrystalline silicon films and the amorphous silicon films remain only on the surfaces of the cylindrical capacitor openings 17c, for forming the capacitor lower electrodes 21 as shown in FIG. 16.

Then, tantalum pentoxide films 500 for defining capacitor dielectric films are formed on the surfaces of the capacitor lower electrodes 21 and the silicon oxide film 15. Then, films containing titanium nitride for configuring capacitor upper electrodes 22 are formed on the tantalum pentoxide films. Thereafter patterning is performed with photoresist, thereby obtaining the structure shown in FIG. 17. Consequently, the capacitors are completed.

Figure 18:
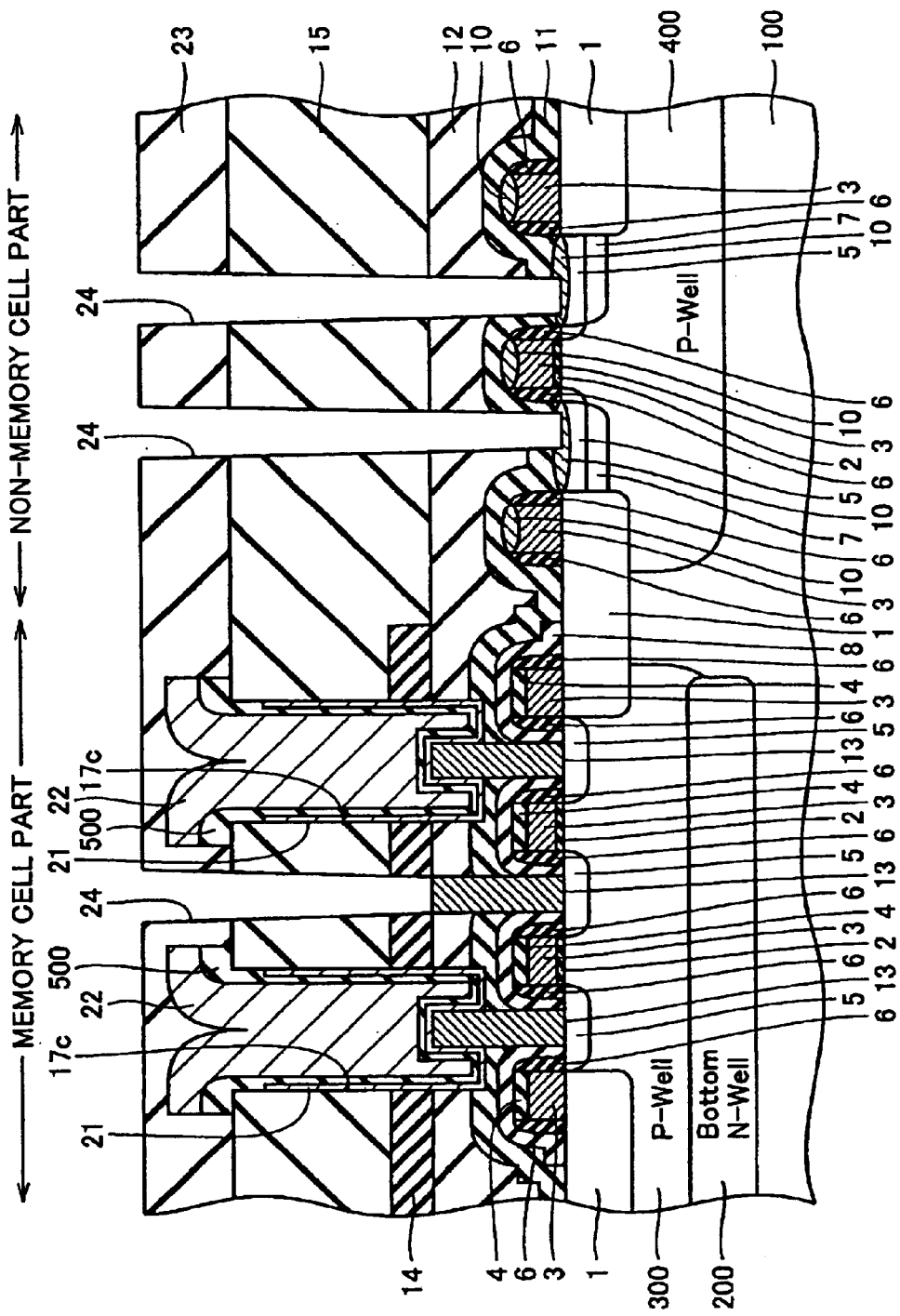

A silicon oxide film 23 of plasma TEOS is formed on the silicon oxide film 15 to cover the capacitor upper electrodes 22. Thereafter the surface of the silicon oxide film 23 is flattened by CMP. Then, contact holes 24 are formed to reach the central polycrystalline silicon plug 13 and a central gate electrode 3 (not shown) of a memory cell part and portions of a low-resistance cobalt silicide film 10 and gate electrodes 3 (not shown) of a non-memory cell part. Thus, the structure shown in FIG. 18 is obtained.

At this time, etching is performed in two stages for forming the contact holes 24. In the first stage, the etching is completed when the bottom surfaces of the contact holes 24 are located in the portions of the silicon nitride films 14 and 11 corresponding to the memory cell part and the non-memory cell part respectively. In the second stage, the contact holes 24 pass through the silicon nitride films 14 and 11 respectively for exposing the surfaces of the central polycrystalline silicon plug 13 and the low-resistance cobalt silicide film 10.

Figure 19:
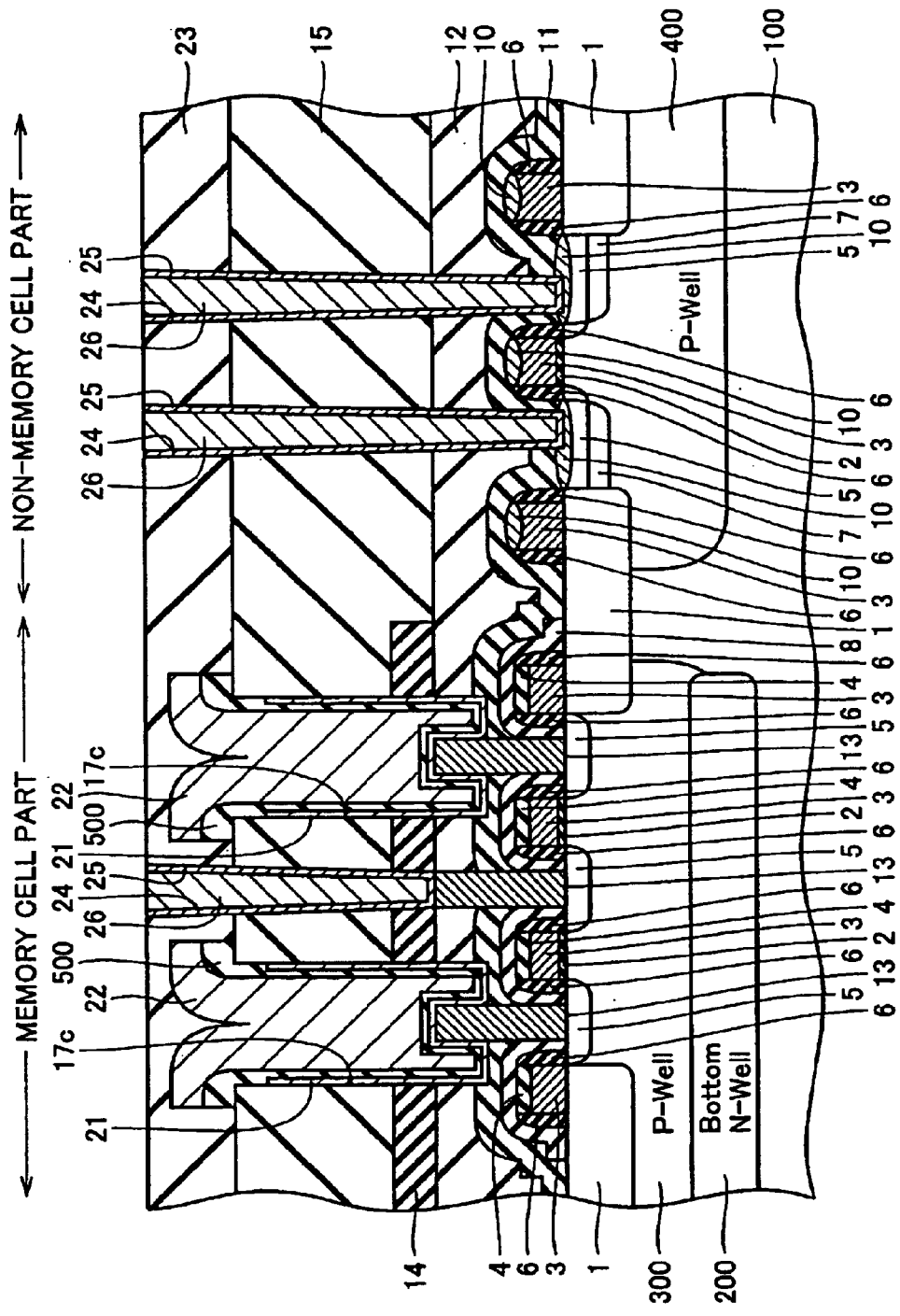

Thereafter the contact holes 24 are sequentially filled with titanium nitride films for forming barrier metal films 25 and tungsten films for forming contact plugs 26. Thus, the structure shown in FIG. 19 is obtained.

Thereafter aluminum wiring layers 28 vertically held between titanium nitride films 27 and 29 are formed to be in contact with the upper surfaces of the contact plugs 26. Thus, the structure shown in FIG. 14 is obtained.

In the aforementioned method of fabricating the semiconductor device according to the second embodiment, the height of the capacitor lower electrodes 21 can be increased by a value $A^+$ without increasing the height B of the contact plugs 26 in the non-memory cell part shown in FIG. 14. According to the aforementioned method of fabricating the semiconductor device, further, the polycrystalline silicon plugs 13 project from the silicon nitride film 11, thereby increasing the surface areas of the capacitor lower electrodes 21 as compared with the first embodiment. Consequently, the capacitances of the capacitors are increased. Therefore, the semiconductor device is improved in refreshability and soft error resistance.

The process of forming the cylindrical capacitor openings 17c shown in FIG. 15 in the aforementioned semiconductor device according to the second embodiment has the following effect: In general, the photoresist pattern 16 is employed as a mask for forming openings in the silicon oxide film 15 and thereafter removed, and the silicon oxide film 15 is thereafter employed as a mask for partially removing the silicon nitride film 14 through complicated steps. In the method of fabricating the semiconductor device according to the second embodiment, however, the photoresist pattern 16 is employed as a mask for simultaneously partially removing the silicon nitride film 11, the silicon nitride film 14 and the silicon oxide film as shown in FIG. 15, whereby the number of steps can be remarkably reduced.

Third Embodiment

The structure of a semiconductor device according to a third embodiment of the present invention is now described with reference to FIG. 20.

Figure 20:
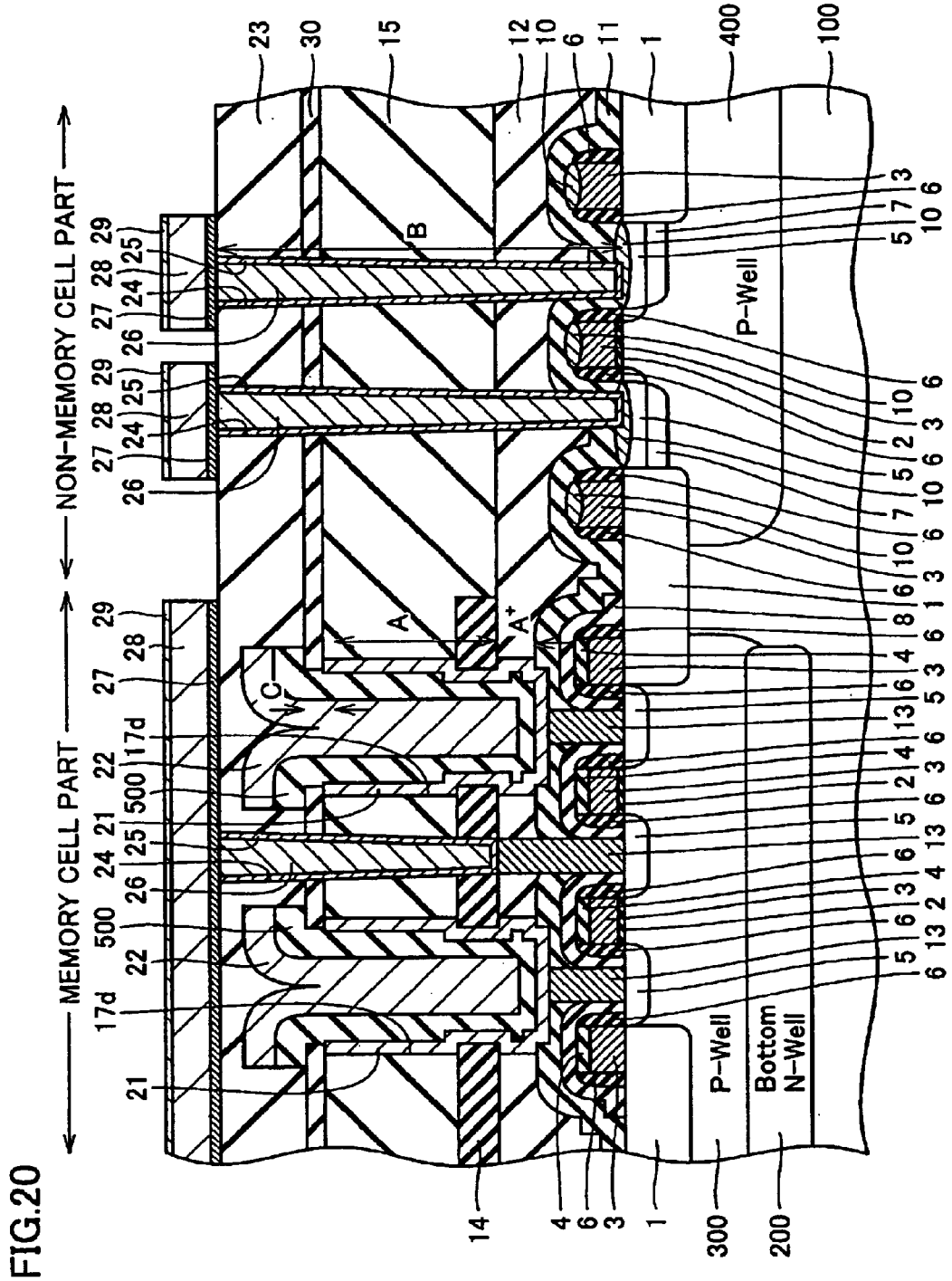
FIG. 20 is a diagram for illustrating the structure of a semiconductor device according to a third embodiment of the present invention.

The structure of the semiconductor device according to the third embodiment is substantially similar to that of the semiconductor device according to the first or second embodiment shown in FIG. 1 or 14, except the following point:

In the semiconductor device according to the third embodiment, a silicon oxide film 30 doped with no impurity is provided between silicon oxide films 15 and 23, as shown in FIG. 20. This silicon oxide film 30 may be replaced with a silicon nitride film.

Further, cylindrical capacitor openings 17d are located on positions where side surfaces of a silicon oxide film 12 and the silicon oxide film 15 are outwardly spread as compared with the cylindrical capacitor openings 17b or 17c according to the first or second embodiment. In other words, side surfaces of silicon nitride films 11 and 14 and the silicon oxide film 30 or the silicon nitride film substituting therefor are inwardly located beyond the side surfaces of the silicon oxide films 12 and 15 in the cylindrical capacitor openings 17d of the semiconductor device according to the third embodiment.

Capacitor lower electrodes 21 are formed over the entire inner side surfaces of the cylindrical capacitor openings 17d along the inner side surfaces.

According to the aforementioned structure, the surface areas of the capacitor lower electrodes 21 can be maximized in the cylindrical capacitor openings 17d without providing away the upper portions of the cylindrical capacitor openings 17d from the main surface of a semiconductor substrate 100. When the upper surfaces of the cylindrical capacitor openings 17d forming capacitors of a memory cell part cannot be upwardly located, therefore, the capacitances of the capacitors can be maximized.

A method of fabricating the semiconductor device according to the third embodiment is now described with reference to FIGS. 21 to 23. In the method of fabricating the semiconductor device according to the third embodiment, a structure similar to that shown in FIG. 8 is prepared through a process similar to that for the semiconductor device according to the first embodiment.

Then, the silicon oxide film 15 of BPTEOS or USG is stacked to cover the silicon oxide film 12 and the silicon nitride film 14. Thereafter the surface of the silicon oxide film 15 is flattened. Then, the silicon oxide film 30 of USG is formed on the silicon oxide film 15. Thereafter a photoresist pattern 16 is formed on the silicon oxide film 30.

This photoresist pattern 16 is employed as a mask for performing dry etching, thereby forming the cylindrical capacitor openings 17d to pass through the silicon oxide films 30 and 15, the silicon nitride film 14 and the silicon oxide film 12 while partially removing the silicon nitride film 11 up to a prescribed depth from the surface thereof. Thus, the structure shown in FIG. 21 is obtained.

Figure 21:
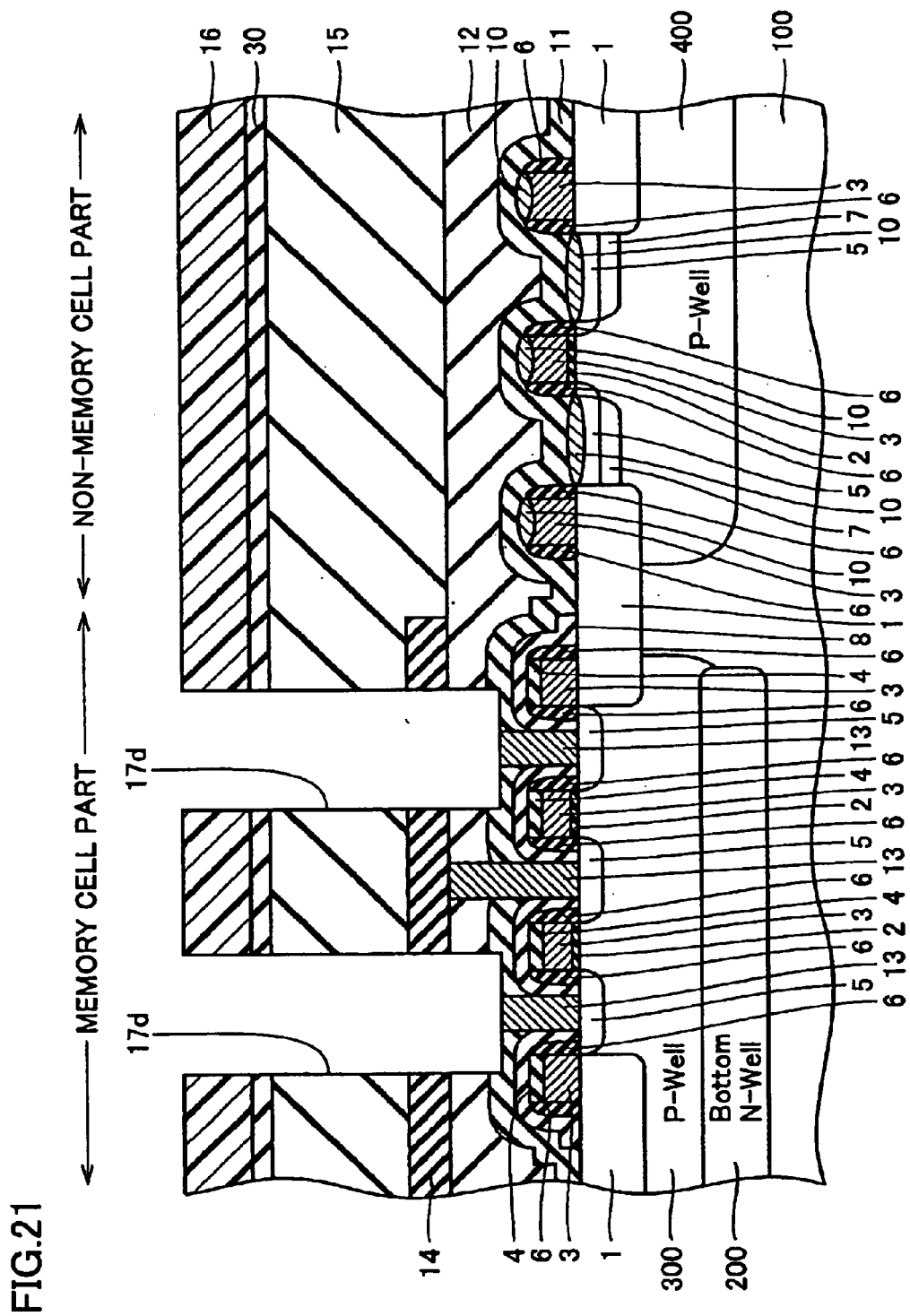
FIGS. 21 to 24 are diagrams for illustrating a method of fabricating the semiconductor device according to the third embodiment.

The structure shown in FIG. 21 can be obtained by improving the selection ratio of the silicon oxide films 12, 15 and 30 or the silicon nitride film 14 with respect to resist in dry etching.

Further, the photoresist pattern 16 is employed as a mask for performing hydrofluoric acid treatment. Thus, the silicon oxide films 12 and 15 of BPTEOS or PSG having a high ratio of the etching rate with respect to hydrofluoric acid are largely etched as compared with the silicon oxide film 30 of USG and the silicon nitride films 11 and 14 having a low ratio of the etching rate with respect to hydrofluoric acid. Therefore, the side walls of the silicon oxide films 12 and 15 are located outward beyond those of the silicon oxide film 30 and the silicon nitride films 11 and 14 in a direction parallel to the main surface of the semiconductor substrate 100, as shown in FIG. 22.

Polycrystalline silicon films doped with phosphorus and amorphous silicon films doped with no impurities are formed on the surfaces of the cylindrical capacitor openings 17d for defining the capacitor lower electrodes 21. Thereafter the surface areas of the amorphous silicon films are increased by surface treatment.

Then, the cylindrical capacitor openings 17d are covered with photoresist films, which in turn are employed as masks for anisotropically etching the polycrystalline silicon films and the amorphous silicon films. Thus, the polycrystalline silicon films and the amorphous silicon films remain only on the surfaces of the cylindrical capacitor openings 17d for forming the capacitor lower electrodes 21, as shown in FIG. 23.

At this time, the thickness of the silicon oxide film 30 is defined by the quantity C of regression of the capacitor lower electrodes 21 due to a screening effect of projecting portions of the silicon oxide film 30 consisting of USG. Therefore, the quantity C of regression of the capacitor lower electrodes 21 can be minimized by reducing the thickness of the silicon oxide film 30 to the minimum.

Figure 24:
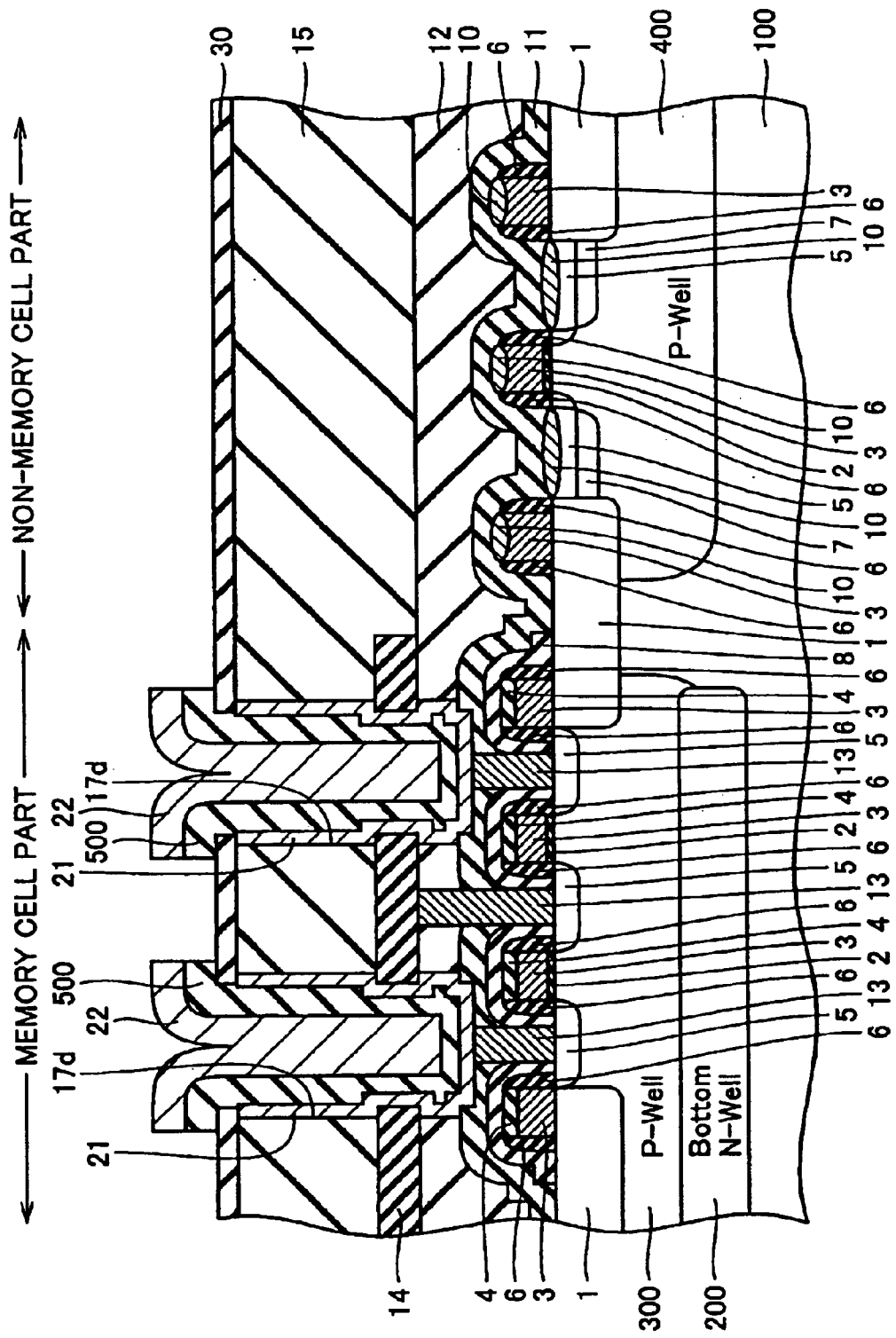

Then, tantalum pentoxide films serving as capacitor dielectric films 500 are formed on the surfaces of the capacitor lower electrodes 21 and the silicon oxide film 15. Then, films containing titanium nitride serving as capacitor upper electrodes 22 are formed on the tantalum pentoxide films. Thereafter patterning is performed with photoresist, thereby obtaining the structure shown in FIG. 24. Consequently, the capacitors are completed.

A silicon oxide film 23 of plasma TEOS is formed on the capacitor upper electrodes 22. Thereafter the surface of the silicon oxide film 23 is flattened by CMP. Then, contact holes 24 are formed to reach a central polycrystalline silicon plug 13 and a gate electrode 3 (not shown) of a memory cell part and a low-resistance cobalt silicide film 10 and gate electrodes 3 (not shown) of a non-memory cell part.

At this time, etching is performed in two stages for forming the contact holes 24. In the first stage, the etching is completed when the bottom surfaces of the contact holes 24 are located in the portions of the silicon nitride films 14 and 11 corresponding to the memory cell part and the non-memory cell part respectively. In the second stage, the contact holes 24 pass through the silicon nitride films 14 and 11 respectively for exposing the surfaces of the central polycrystalline silicon plug 13 and the low-resistance cobalt silicide film 10.

Thereafter the contact holes 24 are sequentially filled with titanium nitride films for forming barrier metal films 25 and tungsten films for forming contact plugs 26. Thereafter aluminum wiring layers 28 vertically held between titanium nitride films 27 and 29 are formed to be in contact with the upper surfaces of the contact plugs 26. Thus, the structure shown in FIG. 20 is obtained.

In the aforementioned method of fabricating the semiconductor device according to the third embodiment, the height of the capacitor lower electrodes 21 can be increased by a value $A^+$ without increasing the height B of the contact plugs 26 in the non-memory cell part. Consequently, the capacitances of the capacitors are increased. Therefore, the semiconductor device is improved in refreshability and soft error resistance.

Figure 22:
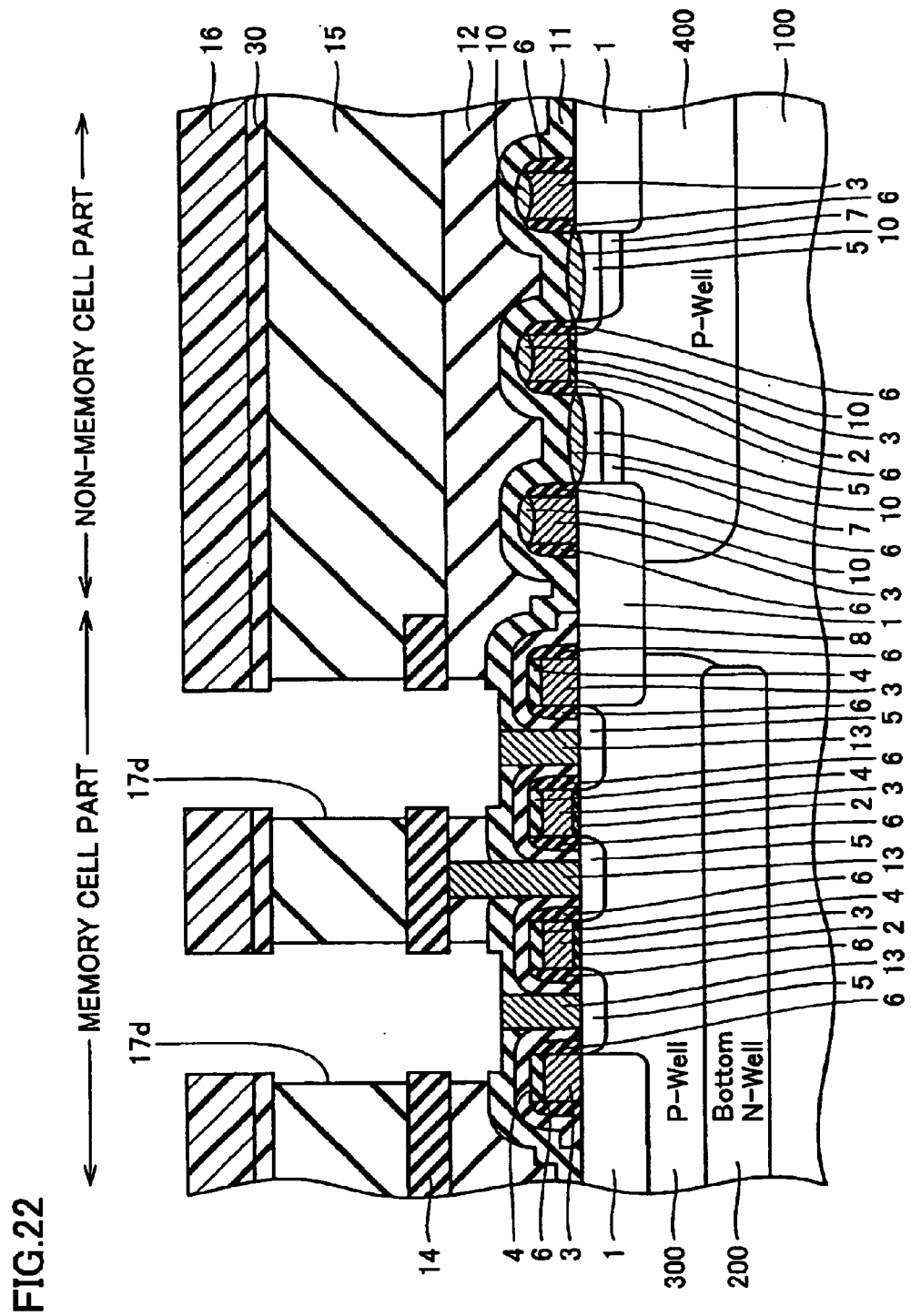
Figure 23:
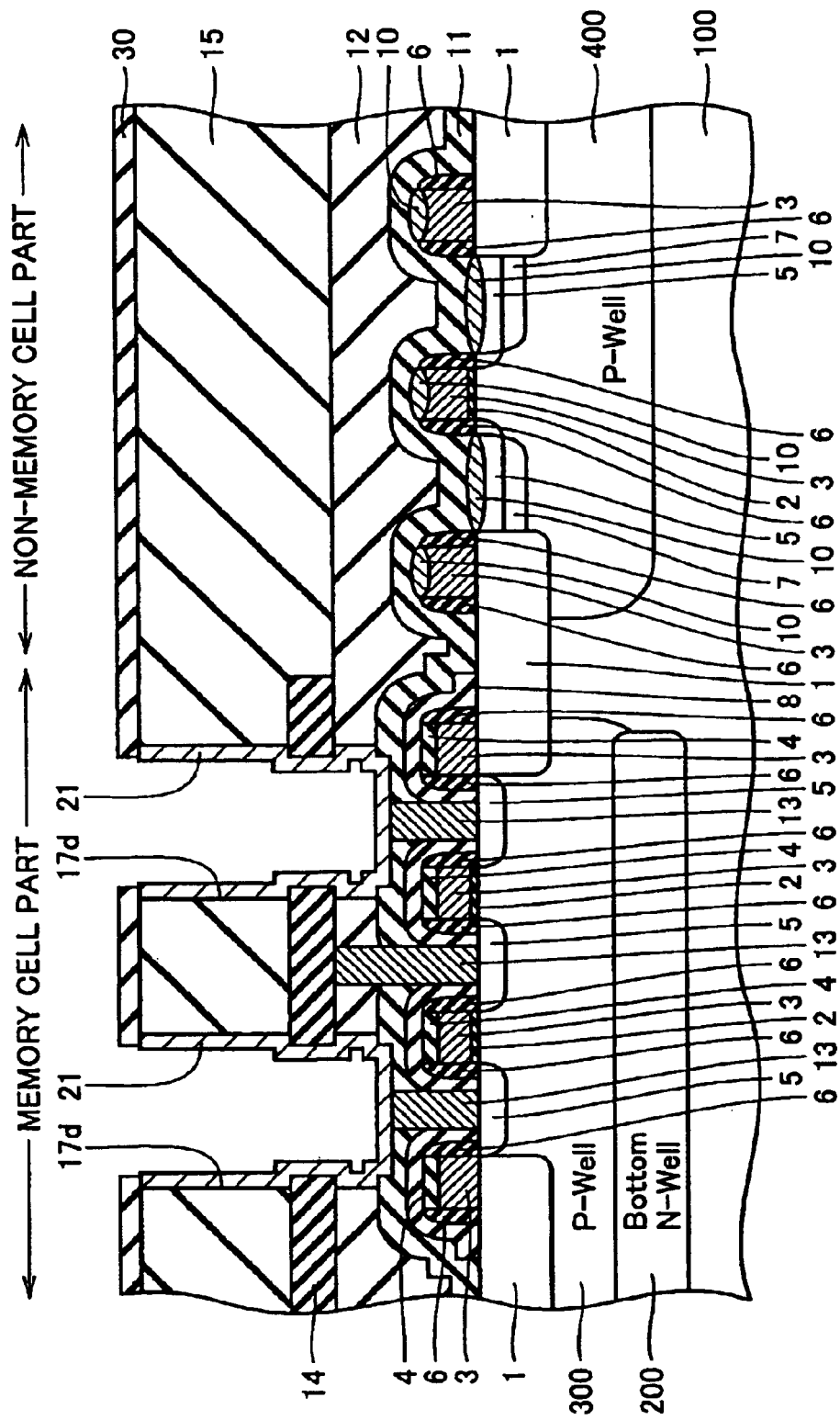

The process of forming the cylindrical capacitor openings 17d shown in FIG. 22 in the aforementioned semiconductor device according to the third embodiment has the following effect: In general, the photoresist pattern 16 is employed as a mask for forming openings in the silicon oxide film 15 and thereafter removed, and the silicon oxide film 15 is thereafter employed as a mask for partially removing the silicon nitride film 14 through complicated steps. In the method of fabricating the semiconductor device according to the third embodiment, however, the photoresist pattern 16 is employed as a mask for simultaneously partially removing the silicon nitride films 11 and 14, the silicon oxide film 15 and the polycrystalline silicon plugs 13 as shown in FIG. 22, whereby the number of steps can be remarkably reduced.

When the thickness of the silicon oxide film 30 is set small, further, the quantity C of regression of the capacitor lower electrodes 21 can be reduced as compared with that of conventional capacitor lower electrodes. This effect of reducing the quantity C of regression is attained also when the silicon oxide film 30 is replaced with a silicon nitride film.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor device comprising:

a transistor provided on a semiconductor substrate;

a first etching stopper film formed to cover said transistor;

a first insulator film formed on said first etching stopper film;

a second etching stopper film formed on said first insulator film to cover said transistor;

a second insulator film formed on said second etching stopper film; and a capacitor electrically connected to said transistor, wherein a lower electrode, a dielectric film and an upper electrode of said capacitor are sequentially formed in a hole extending perpendicularly to the main surface of said semiconductor substrate along the surface of said hole, and said hole passes through said second insulator film, said second etching stopper film and said first insulator film while the bottom surface of said hole is formed using said first etching stopper film.

2. The semiconductor device according to claim 1, wherein said capacitor and said transistor are electrically connected with each other by a contact plug extending perpendicularly to the main surface of said semiconductor substrate, and said contact plug projects upward beyond the bottom surface of said hole.

3. A semiconductor device comprising:

a semiconductor substrate;

a first insulator film formed above said semiconductor substrate to extend substantially in parallel with the main surface of said semiconductor substrate;

a first hole passing through said first insulator film perpendicularly to the main surface of said semiconductor substrate;

a second insulator film formed on said first insulator film; and a second hole located inside the opening of said first hole to pass through said films second insulator film perpendicularly to the main surface of said semiconductor substrate, wherein a capacitor lower electrode is formed over the entire inner side surface of said first hole along the inner side surface; and said second insulator film is formed so as to cover the upper surface of the upper end portion of said capacitor lower electrode.

* * * * *